(12) United States Patent
Huang et al.

(10) Patent No.: US 11,276,541 B2
(45) Date of Patent: Mar. 15, 2022

(54) SWITCH UNIT, DISPLAY PANEL, MANUFACTURING METHOD THEREOF, AND DISPLAY APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Zhonghao Huang, Beijing (CN); Jun Wang, Beijing (CN); Yongliang Zhao, Beijing (CN); Seungmoo Rim, Beijing (CN); Taeyup Min, Beijing (CN)

(73) Assignees: CHONGQING BOE OPTOELECTRONICS TECHNOLOGY CO., LTD, Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 546 days.

(21) Appl. No.: 16/333,350

(22) PCT Filed: Jul. 2, 2018

(86) PCT No.: PCT/CN2018/094076
§ 371 (c)(1),
(2) Date: Mar. 14, 2019

(87) PCT Pub. No.: WO2019/062246
PCT Pub. Date: Apr. 4, 2019

(65) Prior Publication Data
US 2021/0358708 A1 Nov. 18, 2021

(30) Foreign Application Priority Data
Sep. 26, 2017 (CN) .......................... 201710884341.3

(51) Int. Cl.
*H01H 57/00* (2006.01)
*H01L 25/18* (2006.01)
(Continued)

(52) U.S. Cl.
CPC ............. *H01H 57/00* (2013.01); *G02F 1/136* (2013.01); *H01L 25/18* (2013.01); *H01L 27/20* (2013.01);
(Continued)

(58) Field of Classification Search
CPC .. H01H 57/00; H01H 2057/006; G02F 1/136; G02F 1/134309; G02F 1/134363;
(Continued)

(56) References Cited

U.S. PATENT DOCUMENTS 9,500,912 B2  11/2016  Wu et al.
9,651,831 B2  5/2017  Nakamura
(Continued)

FOREIGN PATENT DOCUMENTS

CN  103207486 A  7/2013
CN  104407475 A  3/2015
(Continued)

OTHER PUBLICATIONS

International Search Report dated Sep. 30, 2018, issued in counterpart Application No. PCT/CN2018/094076 (9 pages).
(Continued)

*Primary Examiner* — Donald L Raleigh
(74) *Attorney, Agent, or Firm* — Westerman, Hattori, Daniels & Adrian, LLP

(57) ABSTRACT

The present disclosure is related to a display panel. The display panel may include a plurality of switch units. Each of the plurality of switch units may include a first electrode; a second electrode; a third electrode; a fourth electrode opposite the first electrode; a piezoelectric material
(Continued)

layer between the first electrode and the fourth electrode; a connecting electrode above the fourth electrode and electrically insulated from the fourth electrode; and a driving transistor comprising a driving gate. The driving gate may be the third electrode. An orthogonal projection of the second electrode and an orthogonal projection of the third electrode on a plane of the connecting electrode may overlap the connecting electrode respectively.

20 Claims, 33 Drawing Sheets

(51) Int. Cl.

| | | |
|---|---|---|
| *H01L 27/32* | (2006.01) | |
| *H01L 41/09* | (2006.01) | |
| *H01L 27/20* | (2006.01) | |
| *H01L 41/29* | (2013.01) | |
| *G02F 1/136* | (2006.01) | |
| *G02F 1/1343* | (2006.01) | |
| *H01L 41/187* | (2006.01) | |

(52) U.S. Cl.
CPC ...... *H01L 27/3232* (2013.01); *H01L 27/3251* (2013.01); *H01L 27/3281* (2013.01); *H01L 41/0986* (2013.01); *H01L 41/29* (2013.01); *G02F 1/134309* (2013.01); *G02F 1/134363* (2013.01); *H01H 2057/006* (2013.01); *H01L 41/1875* (2013.01)

(58) Field of Classification Search
CPC ..... H01L 25/18; H01L 27/20; H01L 27/3232; H01L 27/3251; H01L 27/3281; H01L 41/0986; H01L 41/29; H01L 41/1875
See application file for complete search history.

(56) References Cited

U.S. PATENT DOCUMENTS

| | | |
|---|---|---|
| 2013/0009668 A1* | 1/2013 | Elmegreen .............. H01L 49/00 326/102 |
| 2013/0120284 A1 | 5/2013 | Chen et al. |
| 2015/0171312 A1 | 6/2015 | Honda |
| 2016/0049453 A1 | 2/2016 | Kang |

FOREIGN PATENT DOCUMENTS

| | | |
|---|---|---|
| CN | 104460125 A | 3/2015 |
| CN | 204203592 U | 3/2015 |
| EP | 1942525 A2 | 7/2008 |
| EP | 1 976 015 A2 | 10/2008 |
| GN | 2651726 Y | 10/2004 |
| GN | 101231390 A | 7/2008 |

OTHER PUBLICATIONS

Office Action dated May 22, 2020, issued in counterpart CN application No. 201710884341.3, with English translation. (30 pages).

Extended (Supplementary) European Search Report dated May 21, 2021, issued in counterpart EP application No. 18857381.0. (10 pages).

* cited by examiner

SWITCH UNIT, DISPLAY PANEL, MANUFACTURING METHOD THEREOF, AND DISPLAY APPARATUS

CROSS-REFERENCE TO RELATED APPLICATIONS

This application claims benefit of the filing date of Chinese Patent Application No. 201710884341.3 filed on Sep. 26, 2017, the disclosure of which is hereby incorporated in its entirety by reference.

TECHNICAL FIELD

This disclosure relates to display technology, in particular, to a switch unit, a display panel, a manufacturing method thereof and a display apparatus.

BACKGROUND

Currently, the display products are mainly composed of two types: thin film transistor liquid crystal display products (TFT-LCD) and active matrix organic light-emitting display products (AMOLED).

The TFT-LCD product mainly uses amorphous silicon, low-temperature polysilicon, semiconductor oxide (eg, indium gallium zinc oxide) or other semiconductor materials to form an insulated gate field effect transistor with a gate, a source, and a drain. Under the control of the gate scan line and the signal line, the pixel capacitor is charged and discharged, and the field-induced deflection of the liquid crystals of each pixel is controlled to achieve the purpose of display. The TFT-LCD product has advantages such as mature technology, high yield, and long service life. The disadvantages thereof are low transmittance of the panel, passive light emission, high power consumption, and limited pixel response time due to liquid crystal deflection.

The AMOLED product mainly uses high-mobility low-temperature polysilicon or oxide semiconductor field effect transistor TFT to form a multi-level driving circuit, and the driving current is loaded on the anode and the cathode at both ends of the organic light-emitting material. Electrons in the cathode (usually metal electrodes) reach the Emitting Layer (EL) through the electron transport layer (ETL). At the same time, holes in the anode (usually transparent electrode such as Indium Tin Oxide) reach the EL layer through the hole transport layer (HTL). Electrons and holes recombine in the EL layer, creating excitons in the excited state and exciting the electron transitions of the organic light-emitting molecules to the excited state. When the excited electrons of the organic light-emitting molecule transit back to the ground state, they emit energy in the form of emitted electromagnetic waves (photons) to achieve light emission. AMOLED has the advantages such as active light emission, flexible display support, high contrast, short response time, high luminous efficiency, and low power consumption.

BRIEF SUMMARY

Accordingly, one example of the present disclosure is a display panel. The display panel may include a plurality of switch units. Each of the plurality of the switch units may include a first electrode, a second electrode, a third electrode, a fourth electrode opposite the first electrode, a piezoelectric material layer between the first electrode and the fourth electrode, a connecting electrode between the second electrode/the third electrode and the fourth electrode, and a driving transistor comprising a driving gate. The driving gate may be the third electrode. An orthogonal projection of the second electrode and an orthogonal projection of the third electrode on a plane of the connecting electrode overlap the connecting electrode respectively and there is a first distance respectively between the second electrode and the connecting electrode and between the third electrode and the connecting electrode along a direction perpendicular to the plane of the connecting electrode. The driving transistor may be configured to drive an OLED component to emit light.

The display panel may further include a first substrate, a second substrate opposite the first substrate, and a plurality of sub-pixel units controlled by the plurality of the switch units respectively. The first electrode, the fourth electrode, the piezoelectric material layer, and the connecting electrode may be on a surface of the first substrate facing the second substrate; and the second electrode, the third electrode, and the sub-pixel units may be on a surface of the second substrate facing the first substrate.

In a row of the switch units, first electrodes thereof may be sequentially connected to form a first metal scan line, fourth electrodes thereof may be sequentially connected to form a second metal scan line, and piezoelectric material layers thereof may be sequentially connected to form a piezoelectric material line. The first metal scan line, the second metal scan line, and the piezoelectric material line may constitute a piezoelectric scan line; and connecting electrodes of the row of the switching unit may be arranged on the piezoelectric scanning line at intervals.

The display panel may further include a support between the first substrate and the second substrate. The support may be located between two adjacent piezoelectric scanning lines on the first substrate or at a side of the piezoelectric scanning line opposite from a scanning drive circuit on the first substrate. The support may be configured to maintain the first distance respectively between the second electrode and the connecting electrode and between the third electrode and the connecting electrode.

The display panel may further include an insulating protective layer on the piezoelectric scanning line. The connecting electrodes may be disposed on the insulating protective layer.

The display panel may further include a first metal wire and a first bonding electrode disposed in the same layer as the first metal scan line. The first metal scan line may be in a display area of the first substrate, the first metal wire and the first bonding electrode may be outside the display area, and the first metal scan line may be electrically coupled to the first bonding electrode through the first metal wire. One end of the second metal scan line may be a signal input terminal, and the insulating protective layer may cover the second metal scan line except the signal input terminal. A surface of the signal input terminal may be covered with a first reserved pattern made of a same material as the connecting electrode, and a conductive adhesive may cover a surface of the first reserved pattern for transmitting a common signal on the first substrate to the signal input terminal. The piezoelectric material line may include a first piezoelectric material layer and a second piezoelectric material layer, and directions of deformation of the first piezoelectric material layer and the second piezoelectric material layer under an electric field may be cumulative. An auxiliary electrode may be between the first piezoelectric material layer and the second piezoelectric material layer.

Each of the plurality of the sub-pixel units may include the OLED component. The OLED component may include an OLED first electrode, a light emitting functional layer, and an OLED second electrode sequentially disposed in a direction away from the second substrate.

The display panel may further include a first insulating layer on a surface of the OLED component. The first insulating layer may include a plurality of first through holes and a plurality of parallel driving signal lines on the first insulating layer. Each of the plurality of first through holes may expose the OLED second electrode. Each of the driving signal lines may correspond to a column of OLED components. The driving resistor may further include a driving source and a driving drain opposite the driving source, and a semiconductor layer in contact with the driving source and the driving drain. The driving drain and each of the driving signal lines may be disposed in a same layer and have a same thickness. The driving drain may be electrically coupled to the OLED second electrodes through a first through hole in the first insulating layer, and a part of each of the driving signal lines directly opposite the driving drain may be the driving source.

The display panel may further include a second insulating layer covering the OLED component, the driving transistor and the driving signal lines; and a plurality of switching signal lines and a plurality of third electrodes on the second insulating layer. A surface of each of the plurality of the switching signal lines facing the first substrate and a surface of each of plurality of the third electrodes facing the first substrate may be at the same level. The switching signal lines and the third electrodes may have a same thickness; an orthogonal projection of each of the plurality of the switching signal lines on the plane where the piezoelectric scan line is located may intersect the piezoelectric scan line to form an intersecting region, and a portion of each of the switching signal lines directly opposite the intersecting region may be the second electrode. A side of the support facing the second substrate may be in contact with the second insulating layer.

A part of the driving drain, a part of the second insulating layer, and a part of each of the third electrodes may constitute a storage capacitor.

The display panel may further include a second metal wire and a second bonding electrode on the second substrate in the same layer as the driving signal lines. The driving signal lines may be disposed in a display area of the second substrate; the second metal wires and the second bonding electrodes may be disposed outside the display area; and the driving signal lines may be electrically connected to the second binding electrodes through the second metal wires. The OLED first electrode of each of the OLED components may be connected together to form a unitary common OLED first electrode.

Each of the sub-pixel units may further include a pixel electrode electrically coupled to the third electrode. The display panel may further include a color film substrate, a liquid crystal layer, and a common electrode. The color film substrate may be at a side of the second substrate away from the first substrate; and the liquid crystal layer may be between the second substrate and the color film substrate. A common electrode may be at a side of the second substrate facing the liquid crystal layer, or the common electrode may be on the color film substrate.

The display panel may further include a plurality of switching signal lines and a plurality of third electrodes on the second substrate. A surface of each of the plurality of the switching signal lines facing the first substrate and a surface of each of plurality of the third electrodes facing the first substrate may be at the same level. The first distance may be in a range of approximately 0.1 µm to 0.5 µm.

Another example of the present disclosure is a display apparatus. The display apparatus may include the display panel according to one embodiment of the present disclosure.

Another example of the present disclosure is a switch unit. The switch unit may include a first electrode; a second electrode; a third electrode; a fourth electrode opposite the first electrode; a piezoelectric material layer between the first electrode and the fourth electrode; and a connecting electrode between the second electrode/the third electrode and the fourth electrode. An orthogonal projection of the second electrode and an orthogonal projection of the third electrode on a plane of the connecting electrode may overlap the connecting electrode respectively and there may be a first distance respectively between the second electrode and the connecting electrode and between the third electrode and the connecting electrode along a direction perpendicular to the plane of the connecting electrode. The first distance may be in a range of approximately 0.1 µm to 0.5 µm.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the are apparent from the following detailed description taken in conjunction with the accompanying drawings in which:

DETAILED DESCRIPTION

Figure 1:
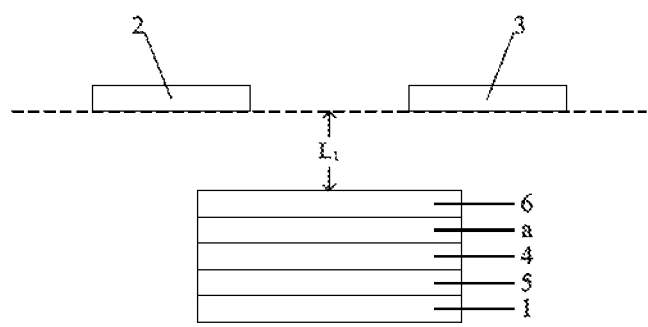
FIG. 1 is a schematic structural diagram of a switch unit according to an embodiment of the present disclosure.
Figure 2:
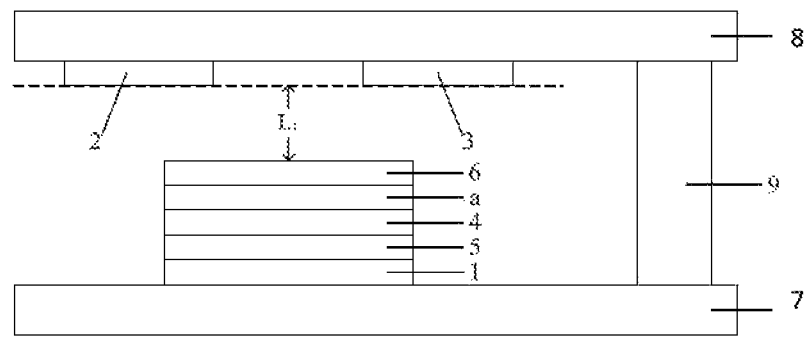
FIG. 2 is a schematic diagram of a partial structure of a display panel according to an embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-33. When referring to the figures, like structures and elements shown throughout are indicated with like reference numerals.

It should be noted that, unless otherwise defined, all terms (including technical and scientific terms) used in the embodiments of the present disclosure have the same meaning as commonly understood by those of ordinary skill in the art to which the present disclosure belongs. It should also be understood that terms such as those defined in a typical dictionary should be construed as having a meaning that is consistent with their meaning in the context of the related art without being interpreted in an idealized or overly formal sense unless expressly so herein defined.

In the description of the present disclosure, the meaning of "plural" is two or more unless otherwise in some embodiments defined.

In the description of the specification, references made to the term "one embodiment," "some example embodiments," and "exemplary embodiments," "example," and "specific example," or "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

A numerical range modified by "approximately" herein means that the upper and lower limits of the numerical range can vary by 10% thereof. A number modified by "approximately" herein means that the number can vary by 10% thereof.

The terms "first," "second," and the like, as used in the description and claims of the present patent application, do not denote any order, quantity, or importance, but rather are used to distinguish between different components. The use of "including" or "comprising" and the like means that the presence of an element or item preceding the word encompasses the use of elements or items listed after the word and their equivalents, without excluding other elements or items. The terms such as "up/above," "down/below," "row/row direction," and "column/column direction" and the like indicate the orientation or positional relationship based on the orientation or positional relationship shown in the drawings, and are only for convenience. The simplified description of the technical solution of the present disclosure is described, but does not indicate or imply that the pointed device or element must have a certain orientation, be constructed and operated in a specific orientation, and therefore should not be construed as limiting the present disclosure. For example, in some cases, embodiments involving "row direction" may be implemented in the "column direction" and so on, and vice versa. The 90-degree rotation or mirroring of the scheme described in this disclosure is also within the scope of this disclosure.

The current various display technologies all rely on semiconductor TFTs to control the display of pixels, which is limited by the limitation of the carrier mobility in the active layer and the on-state current of TFTs. At the same time, the off-state current of the TFT may also be affected by the leakage current of the active layer and thus the complete off-state cannot be realized. In addition, when a silicon semiconductor with a narrow forbidden band width is used as an active layer, the silicon-based semiconductor is less stable due to the effects of light, temperature, and the like. Since the switching performance of the TFT is easily influenced by factors such as carrier mobility, light sensitivity, or thermal sensitivity of the semiconductor, electrical defects are caused and the stability of the TFT switching performance is affected, thereby reducing display quality.

As shown in FIG. 1, an embodiment of the present disclosure provides a switch unit. The switch unit includes a first electrode 1 as a control terminal, a second electrode 2 as an input terminal, and a third electrode 3 as an output terminal. The switch unit further includes a fourth electrode 4 opposite the first electrode 1, a piezoelectric material layer 5 disposed between the first electrode 1 and the fourth electrode 4, and a connecting electrode 6. In some embodiments, the connecting electrode 6 is disposed above the first electrode 1 and electrically insulated from the first electrode 1. In some embodiments, the connecting electrode 6 is disposed above the fourth electrode 4 and electrically insulated from the fourth electrode 4. An orthogonal projection of the second electrode 2 and an orthogonal projection of the third electrode 3 on the plane of the connecting electrode 6 respectively overlap the connecting electrode 6. Along a direction vertical to the plane of the connecting electrode 6, there is a preset first distance respectively between the second electrode 2 and the connecting electrode 6 and between the third electrode 3 and the connecting electrode 6. The preset distance is labeled L1 in the FIG. 1. The first distance refers to a distance between a plane where the connecting electrode is located and a plane where the second electrode and the third electrode are located.

In some embodiments, the connecting electrode 6 is electrically insulated from the adjacent first electrode 1 or fourth electrode 4, and a corresponding insulating material ("a" in FIG. 1) is provided between the two. FIG. 1 only exemplifies that the connecting electrode 6 is disposed over the fourth electrode 4 and electrically insulated from the fourth electrode 4.

In order to explain the embodiment of the present disclosure more clearly, several technical features involved in the above switch unit are explained below.

A piezoelectric material can generate an electric field due to mechanical deformation, and can also produce mechanical deformation due to an electric field. This inherent electromechanical coupling effect makes the piezoelectric material widely used in engineering.

Specifically, when an electric field in a certain direction is applied in the polarization direction of a dielectric material (ie, piezoelectric material), centers of gravity of positive and negative charges in the crystals are displaced due to action of the electric field, thereby resulting in deformation of the crystals and mechanical deformation of the dielectric material in a certain direction. When the applied electric field is reversed, the direction of the mechanical deformation is reversed. For example, the thickness of the dielectric material is changed from the increase to the decrease. When the applied electric field is removed, these deformations or stresses also disappear. This phenomenon is called inverse piezoelectric effect.

The above-mentioned switch unit provided by the embodiments of the present disclosure utilizes the inverse piezoelectric effect of the piezoelectric material layer 5 to form an Inverse piezoelectric transistor (IPZT) including a metal-contact switch formed by the inverse piezoelectric material without relying on an active layer of a conventional semiconductor TFT. Without being held to a particular theory, the operating principle is the following:

As shown in FIG. 1, the orthogonal projections of the second electrode 2 and the third electrode 3 on the plane of the connecting electrode 6 overlap the connecting electrode 6. Along the direction perpendicular to the plane of the connecting electrode 6, there is a preset distance respectively between the second electrode 2 and the connecting electrode 6 and between the third electrode 3 and the connecting electrode 6. As such, under action of an electric field with a preset direction formed between the first electrode 1 and the fourth electrode 4, the thickness of the piezoelectric material layer 5 can be increased by a second value (hereinafter referred to as L2), and the second value L2 is greater than the preset distance L1 (L2 is slightly larger than L1). That is, under action of the electric field formed between the first electrode 1 and the fourth electrode 4, the thickness of the piezoelectric material layer 5 is increased so that the connecting electrode 6 is in contact with the second electrode 2 and the third electrode 3 to ensure that an electrical connection is formed between the second electrode 2 and the third electrode 3. The connecting electrode 6 is disposed above the piezoelectric material layer 5, and the second electrode 3 and the third electrode 3 overlapping the connection electrode 6 are disposed above the connecting electrode 6. Thus, when the thickness of the piezoelectric material layer 5 increases, it is equivalent to raise the height of the connecting electrode 6. Because the second electrode 2 and the third electrode 3 in parallel are above the connecting electrode 6, and the second value L2 is greater than the preset distance L1, it is ensured that the connecting electrode 6 is in contact with the second electrode 2 and the third electrode 3 at the same time. That is, the connecting electrode 6 is respectively electrically coupled to the second electrode 2 and the third electrode 3. As such, the signal on the second electrode 2 as an input terminal can be transmitted to the third electrode 3 as an output terminal via the electrically coupled connecting electrode 6 to display or other type of signal output, thereby achieving conduction of the above-mentioned switch unit.

When the above-mentioned electric field between the first electrode 1 and the fourth electrode 4 is removed or the electric field is reversed, the thickness of the piezoelectric material layer 5 can be restored to the original thickness when the electric field is not applied, or further compressed downward so that the thickness is decreased. As such, the contact between the connecting electrode 6 and the juxtaposed second electrode 2 and third electrode 3 above is disconnected. That is, the electrical connection between the second electrode 2 and the third electrode 3 is disconnected, and the switch unit is turned off.

In some embodiments, the piezoelectric material layer 5 may be polarized in advance so that the direction of deformation under the inverse piezoelectric effect is the thickness direction. Accordingly, the position of the connecting electrode 6 above the piezoelectric material layer 5 is changed to achieve the electrical connection or disconnection between the connecting electrode 6 and the juxtaposed second electrode 2 and third electrode 3 arranged side by side above the connecting electrode.

In the above switch unit, the role of the first electrode 1 as a control terminal is similar to that of a gate of a conventional semiconductor TFT in the prior art. The role of the second electrode 2 as an input terminal is similar to that of a source of a conventional semiconductor TFT in the prior art. The role of the third electrode 3 as an output terminal is similar to that of a drain of a conventional semiconductor TFT in the prior art. However, since there is not a semiconductor active layer in the above-described piezoelectric switch structure IPZT, the conduction of the switch unit is formed by an ohmic contact respectively between the connecting electrode 6 and the second electrode 2 and between the connecting electrode 6 and the third electrode 3. The turnoff of the switch unit is achieved by the open circuit respectively between the connecting electrode 6 and the second electrode 3 and between the connecting electrode 6 and the third electrode 3. Therefore, there will be no such problem that the switching performance is unstable due to the light sensitivity, the temperature sensitivity, and the low carrier mobility of the active layer. Furthermore, as the switch unit is turned off by the open circuit between the connecting electrode 6 and the juxtaposed second electrode 2 and third electrode 3, it is advantageous to realize a completely off state and avoid the problem of leakage current.

In some embodiments, the manner of maintaining the above-mentioned preset distance L1 between the juxtaposed second electrode 2 and third electrode 3 and the connecting electrode 6 may be that the second electrode 2 and the third electrode 3 are disposed on one substrate, and the connecting electrode 6 and the underlying structure of the piezoelectric material layer 5 and the like are disposed on another opposite substrate. The corresponding distance between the juxtaposed second electrode 2 and third electrode 3 and the connecting electrode 6 is maintained by a support such as a support material disposed between the two substrates, so that the deformation of the piezoelectric material layer 5 can be used to achieve on and off of the switch unit.

According to the above switch unit provided by the embodiments of the present disclosure, when a preset electric field is applied to both sides of the piezoelectric material layer 5, the thickness thereof increases so that the above connecting electrode 6 is in contact with the second electrode 2 and the third electrode 3 at the same time. That is, the connecting electrode 6 is respectively electrically coupled to the second electrode 2 and the third electrode 3 so that the signal on the second electrode 2 as an input terminal can be transmitted to the third electrode 3 as an output terminal via the electrically coupled connecting electrode 6. As such, display or other signal outputs are performed, thereby achieving conduction of the switch unit. Since the conduction of the above-mentioned switch unit is not affected by the mobility of the conventional TFT semiconductor in the prior art, but is directly formed by the ohmic contact between the metal electrodes, the switch unit has the on-state current which cannot be achieved by the TFTs of the prior art and also can achieve rapid charge and discharge.

When the above-mentioned electric field between the first electrode 1 and the fourth electrode 4 is removed or the electric field is reversed, the thickness of the piezoelectric material layer 5 can be restored to the original thickness when the electric field is not applied, or further compressed downward so that the thickness is decreased. The thickness becomes smaller so that the contact between the connecting electrode 6 and the juxtaposed second electrode 2 and third electrode 3 arranged side by side above is disconnected. That is, the electrical connection between the second electrode 2 and the third electrode 3 is disconnected, and the switch unit is turned off. Because the turnoff of the switch unit is achieved through the open circuit between the connecting electrode 6 and the juxtaposed second electrode 2 and third electrode 3, it is beneficial to realize a completely off state, thereby avoiding the problem of leakage current and ensuring display stability of the display panel.

In the embodiments of the present disclosure, the conduction of the switch unit is formed by the ohmic contact respectively between the connecting electrode 6 and the second electrode 2 and between the connecting electrode 6 the third electrode 3. The turnoff of the switch unit is achieved by the disconnection between the connecting electrode 6 and the juxtaposed second electrode 3 and third electrode 3. Therefore, there will be no such problem that the switching performance is unstable due to the light sensitivity, the temperature sensitivity, and the low carrier mobility of the active layer. Furthermore, as the switch unit is turned off by the disconnection between the connecting electrode 6 and the juxtaposed second electrode 2 and third electrode 3, it is advantageous to realize a completely off state, thereby avoiding the problem of leakage current.

If the preset distance L1 between the juxtaposed second electrode 2 and third electrode 3 and the connecting electrode 6 is too small, for example, several tens of nanometers, the current is likely to directly tunnel through the present distance, thereby resulting in electrical connection between the juxtaposed second electrode 2 and third electrode 3 and the connecting electrode 6, which were originally in an open state. That is, the leakage current of the switch unit is generated, which affects the switch characteristics. In some embodiments, the preset distance L1 is in a range of about 0.1 µm to about 0.5 µm. As such, the preset distance L1 can ensure that there is no quantum tunneling current between the second electrode 2, the third electrode 3 and the connection electrode 6, which can only be observed when the preset distance is in a nanoscale. Furthermore, the switch unit can be completely turned off to prevent poor electricity caused by the leakage voltage, thereby further improving the display quality of the display panel.

Another example of the present disclosure is a display panel including the switch unit according to some embodiments of the present disclosure. The switch unit provided by the embodiment of the present disclosure may be a switch unit in a display area for controlling a single sub-pixel, or a switch unit in a GOA (Gate Driver on Array) circuit provided at the periphery of the display area.

In some embodiments, in view that the stability of the switch unit in the display area is more important to the overall display quality of the display panel and that it is simpler to prepare a switch unit in a large display area, the switch unit of the present disclosure is a switch unit in a display area for controlling a single sub-pixel.

In some embodiment, the display panel further includes a first substrate 7, a second substrate 8 opposite the first substrate, and a support 9 between the first substrate 7 and the second substrate 8. The support 9 is used to maintain the preset distance L1 between the juxtaposed second electrode 2 and third electrode 3 and the connecting electrodes 6. Furthermore, the display panel further includes a sub-pixel unit controlled by the switch unit (not shown in FIG. 2). The connecting electrode 6, the first electrode 1, the fourth electrode 4, and the piezoelectric material layer 5 are disposed on the above-mentioned first substrate 7. The second electrode 2, the third electrode 3, and the sub-pixel unit are disposed on the above-mentioned second substrate 8. That is, the second electrode 2 as an input terminal and the third electrode 3 as an output terminal in the switch unit are provided on the second substrate 8, and the first electrode 1 as a control terminal and the piezoelectric material layer 5 for changing the relative height of the first electrode 1 are arranged on the first substrate 7 opposite the second substrate.

Specific embodiments of the present disclosure are provided below to describe in detail the specific structures provided on the first substrate 7 and the second substrate 8 respectively.

Embodiment 1

As shown in FIGS. 3 to 10, embodiment 1 of the present disclosure provides a lower substrate. The lower substrate includes a first substrate 7 and corresponding structures disposed on the first substrate 7. Since the sub-pixel units in the display panel are usually arranged in an array in rows and columns, the switch units are preferably arranged in an array. The structures on the corresponding first substrate 7 specifically include the following: in any row of the switch units, the first electrodes 1 are sequentially connected together to form a first metal scan line 10, the fourth electrodes 4 are sequentially connected together to form a second metal scan line 11, and the piezoelectric material layers 5 are sequentially connected together to form a piezoelectric material line 12. The first metal scan line 10, the second metal scan line 11, and the piezoelectric material line 12 constitute a piezoelectric scan line 13. The connecting electrodes 6 in the row of the switching units are arranged on the piezoelectric scanning line 13 at intervals.

In some embodiments, since the first electrodes 1 as the control terminals in a row of switch units receive a same signal, in order to simplify the preparation process, the first electrodes 1 in the row of switch units are sequentially connected together to form the first metal scan line 10. Since the fourth electrodes 4 corresponding to the first electrodes 1 in a row of switch units respectively also receive a same signal, in order to simplify the manufacturing process, the fourth electrodes 4 are sequentially connected together to form the second metal scan line 11 corresponding to the first metal scan line 10. Similarly, in order to simplify the manufacturing process, the piezoelectric material layers 5 are sequentially connected together to form a piezoelectric material line 12. As such, a plurality of parallel piezoelectric scanning lines 13 is formed.

In some embodiments, in order to electrically insulate the connecting electrode 6 from the underlying second metal scan line 11, the display panel further includes an insulating protective layer 14 disposed on the piezoelectric scan line; and discrete block-shaped connecting electrodes 6 are disposed on the insulating protective layer 14.

In some embodiments, in order to provide a corresponding scanning signal to the first metal scan line 10 (ie, the first electrodes 1), the display panel further includes first metal wires 15 and first bonding electrodes 16 disposed in the same layer as the first metal scan lines 10. The first metal scan lines 10 are disposed in the display area of the first substrate 7, and the first metal wires 15 and the first bonding electrodes 16 are disposed outside the display area. Furthermore, the first metal scan line 10 is electrically coupled to the first bonding electrode 16 through the first metal wire 15 to receive a scan signal from a scan driving circuit (driver IC) 17 bound to one end of the first metal scan line 10 in the length direction.

In some embodiments, in order to facilitate binding of the scan driving circuit 17, the second metal scan line 11 is located above the first metal scan line. That is, relative to the first substrate 7, the first metal scan line 10 is located below, and one end of the above second metal scan line 11 is a signal input terminal, and the insulating protective layer 14 covers the second metal scan line 11 except the signal input terminal. That is, the signal input terminal is exposed.

In some embodiments, since the connecting electrode 6 is disposed on the insulating protection layer 14, in order to prevent the patterning process for preparing the connecting electrodes 6 from affecting the exposed signal input terminals of the second metal scanning lines 11 below, the surfaces of the signal input terminals are covered with a first reserved pattern 18 of the same material as the connecting electrodes 6. That is, when the connecting electrode 6 is prepared, the metal layer is also laid on the surface of the signal input terminals on the second metal scan lines 11, and when discrete block-shaped connecting electrodes 6 are formed through a corresponding patterning process, the first reserved patterns 18 covering surfaces of the signal input terminals are also formed.

In some embodiments, the display panel further includes a conductive adhesive 19 covering the surface of the first reserved pattern 18 for transmitting a common signal on the second substrate to the signal input terminal, that is, the common signal is recorded on the second metal scan line 11. In one embodiment, in order to simplify the preparation process, the conductive adhesives 19 covering the surfaces of the respective first reserved patterns 18 may be connected to each other.

In some embodiments, in order to increase the aperture ratio of the display panel, the sum of the line width of the piezoelectric scanning line 12 and the interval between the adjacent two piezoelectric scanning lines 12 is equal to the length of the sub-pixel units in the column direction.

In some embodiments, the support 9 may be disposed on the area of the second substrate 8 where there am no piezoelectric scanning lines 13 and, for example, may be located between two adjacent piezoelectric scanning lines 13. In one embodiment, as shown in FIG. 3, the support 9 is located between two adjacent piezoelectric scanning lines 13 or at a side of the piezoelectric scanning line 13 opposite from the scan drive circuit 17.

Here, a scanning drive circuit for supplying a signal to the piezoelectric scanning line is provided along one side of the piezoelectric scanning line 13 in the longitudinal direction. Therefore, the supports 9 are not provided in this area. Instead, the supports 9 are disposed on the remaining areas where the piezoelectric scanning lines 13 are not provided. As such, the supports 9 can be more uniformly dispersed on the first substrate 7 and provide good supporting function for the opposite second substrate 8.

Figure 3:
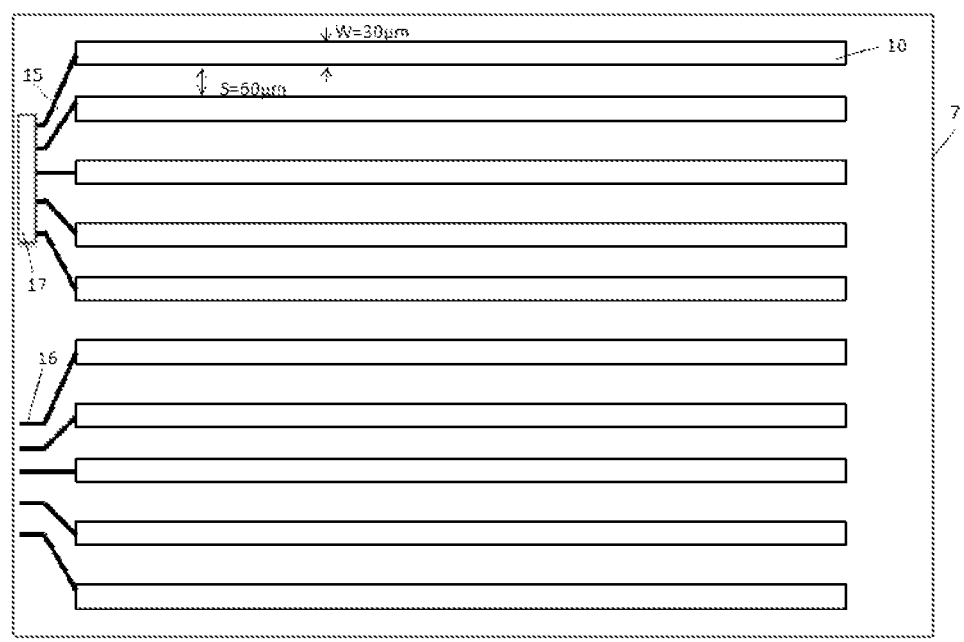
FIG. 3 is a first schematic diagram of a step-by-step structure of a display panel according to Embodiment 1 of the present disclosure.

In some embodiments, the specific preparation process of the lower substrate is as follows:

In step S11, as shown in FIG. 3, a first metal layer is formed by a method such as magnetron sputtering. Then, a first metal scan line 10 (ie, a piezoelectric lower electrode) is formed on the first substrate 7 by a photolithography process. The first substrate 7 is not conductive, its thickness thereof is not limited, and the first substrate 7 may be made of a transparent glass or an opaque ceramic. The material and the thickness of the first metal scan line 10 are not limited, and a corresponding pattern is formed through a mask exposure and a dry or wet etching process.

The first metal scan lines 10 are arranged in parallel in the display area, and the line width and line spacing thereof are determined according to the pixel size of the display area (ie, the size of the sub-pixel unit), and the sum of the line width and the line spacing or interval is equal to the length of the sub-pixel unit in the column direction. In one embodiment, take a 30 µm×90 µm pixel size (about 280 PPI) as an example, the line width of the first metal scan line 10 (W in FIG. 3) can be designed as approximately 30 µm, and the line spacing (S in FIG. 3) can be designed as approximately 60 µm. The pitch of the first metal scan line 10, which is the sum of the line width and the line spacing, is equal to the pitch of the pixels in traverse direction (size).

The first metal scan lines 10 are connected to the one or more first bonding electrodes 16 through the first metal wires 15 (ie, the hub region) outside the display area. As such, the scan driving circuit 17 (ie, the driving C) can load the scan voltage signal on each of the first metal scan lines 10.

Figure 4:
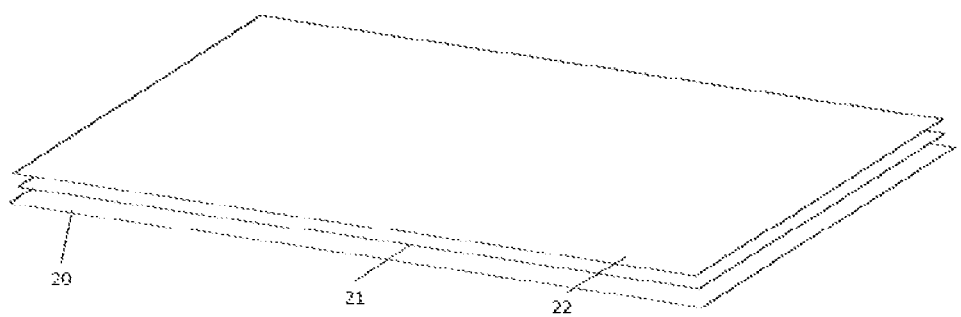
FIG. 4 is a second schematic diagram of a step-by-step structure of a display panel according to Embodiment 1 of the present disclosure.

In step S12, as shown in FIG. 4, a second metal layer 21 and a layer of insulating material 22 are sequentially deposited on a piezoelectric layer 20 having a thickness of, for example, approximately 0.05 mm. The material and thicknesses of the deposited second metal layer 21 and the layer of the insulating material 22 are not limited.

Here, in order to ensure that the deformation of the piezoelectric layer 20 under the inverse piezoelectric effect is concentrated in the thickness direction, the material is required to have a piezoelectric coefficient in a direction perpendicular to the surface direction of the piezoelectric layer 20 as large as possible, and the Curie temperature is higher than the operating temperature such as 100° C.

In some embodiment, for convenience of calculation, a piezoelectric polycrystalline single-crystal piezoelectric sheet of $PbTiO_3$ having a piezoelectric coefficient (d33) of 2000 μm/V, a layer of metal Cu having a thickness of approximately 0.3 μm as the second metal layer 21, and silicon nitride having a thickness of approximately 0.6 μm as the insulating material 22 are used.

Figure 5:
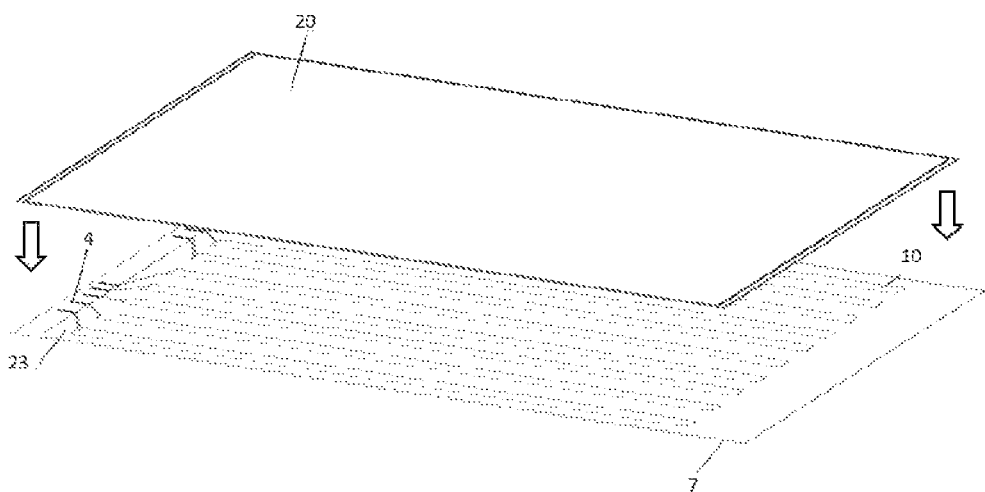
FIG. 5 is a third schematic diagram of a step-by-step structure of a display panel according to Embodiment 1 of the present disclosure.

In Step S13, as shown in FIG. 5, the area of the second substrate 8 other than the first binding electrodes is evenly coated with an insulating adhesive 23, which has a high hardness after solidification. The insulating adhesive 23 may be an epoxy resin. Then, the side of the first substrate coated with the insulating adhesive is attached to the side of the piezoelectric layer 20 on which the metal is not deposited. The combining direction is shown by the arrow in the FIG. 5. Since the piezoelectric layer 20 has an entire layer structure without any pattern, the requirement of the alignment accuracy of the piezoelectric layer 20 and the first substrate 7 is low, and the requirement can be satisfied by the conventional laminating equipment.

Figure 6:
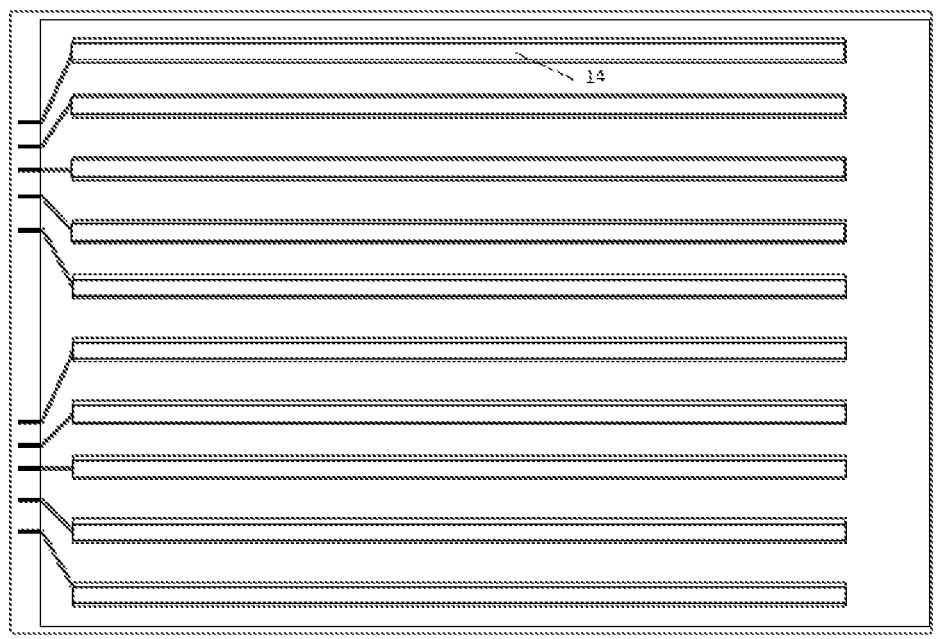
FIG. 6 is a fourth schematic diagram of a step-by-step structure of a display panel according to Embodiment 1 of the present disclosure.

In step S14, as shown in FIG. 6, according to the pattern of the first metal scan lines as an alignment target, a pattern of the insulating protection layers 14 covering the first metal scan lines can be formed on the bonded first substrate by an exposure and a dry etching process. The formed pattern exposes the underlying second metal layer 21. The second metal layer 21 outside the area covered by the insulating protection layer 14 can be removed by dry etching or wet etching to form the second metal scanning lines. After that, the piezoelectric material outside the area covered by the insulating protective layer 14 is removed by dry etching to form piezoelectric material lines.

Figure 7:
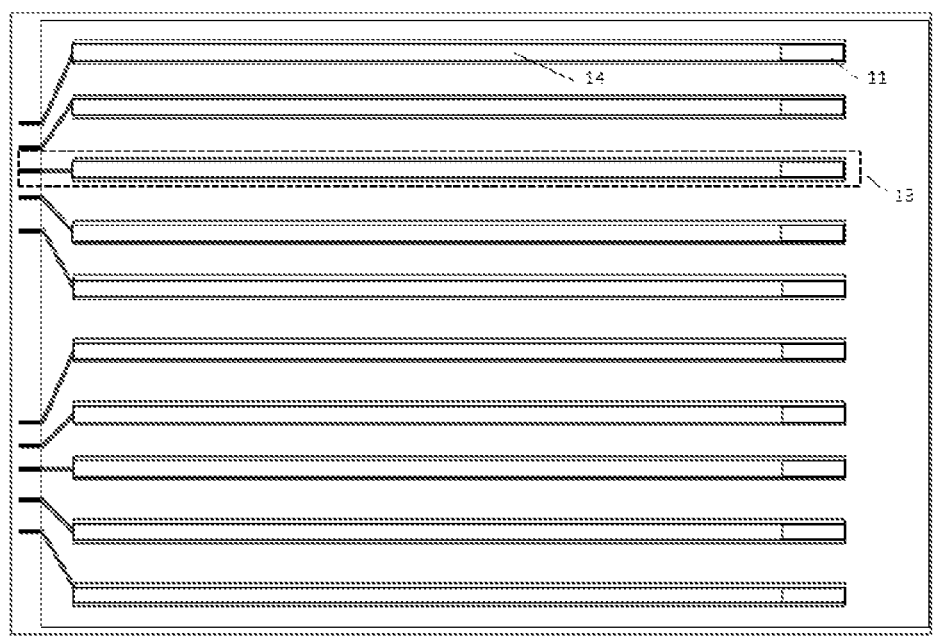
FIG. 7 is a fifth schematic diagram of a step-by-step structure of a display panel according to Embodiment 1 of the present disclosure.

In step S15, as shown in FIG. 7, a part of the insulating protection layer 14 is removed to expose the underlying signal input terminals of the second metal scan lines 11 for inputting the above electrode signals onto the piezoelectric material lines.

The first metal scan line, the piezoelectric material line above, the second metal scan line 11 above (ie, piezoelectric upper electrode line), and the insulating protective layer 14 constitute a piezoelectric scanning line 13 capable of controlling variation of the height thereof by controlling the potential difference between the first metal scan line and the second metal scan line 13.

Figure 8:
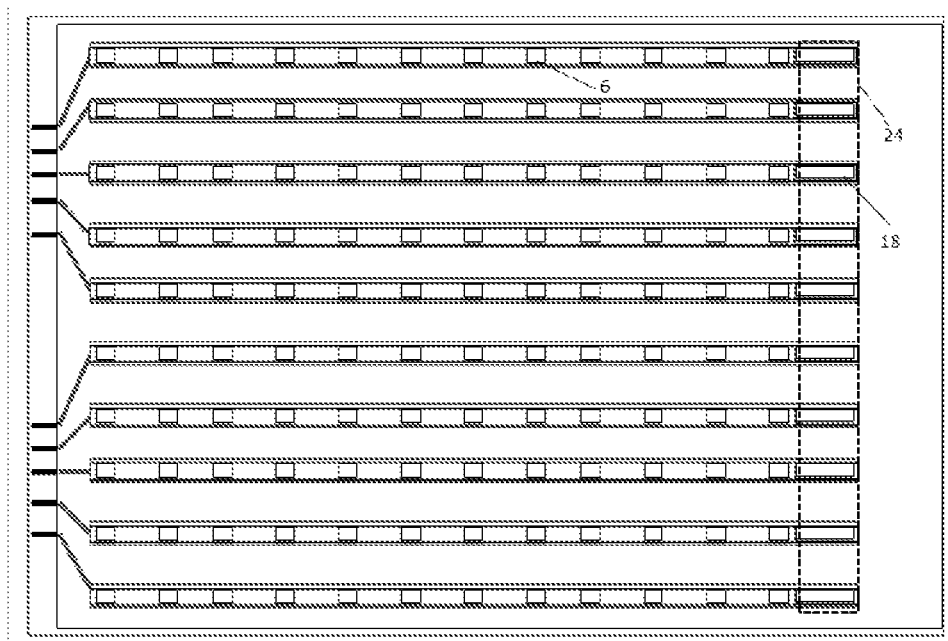
FIG. 8 is a sixth schematic diagram of a step-by-step structure of a display panel according to Embodiment 1 of the present disclosure.

In step S16, as shown in FIG. 8, a third metal layer is deposited on the first substrate after the foregoing steps are completed. Discrete square block-like metal patterns as the connecting electrodes 6 (ie, metal switch) in the switch units are formed on the piezoelectric scanning line by a photolithography process. The connecting electrodes 6 are used for turning on the pixel switches. At the same time, a part of the pattern of the third metal layer on the exposed signal input terminals on the second metal scanning line and on the surfaces of the exposed first binding electrodes are retained as the first reserved patterns 18 to prevent the underlying exposed metal from being etched. Thus, an upper electrode signal input area 24 electrically coupled to the second metal scanning lines 11 is formed at the end of the piezoelectric scanning lines 13.

Figure 9:
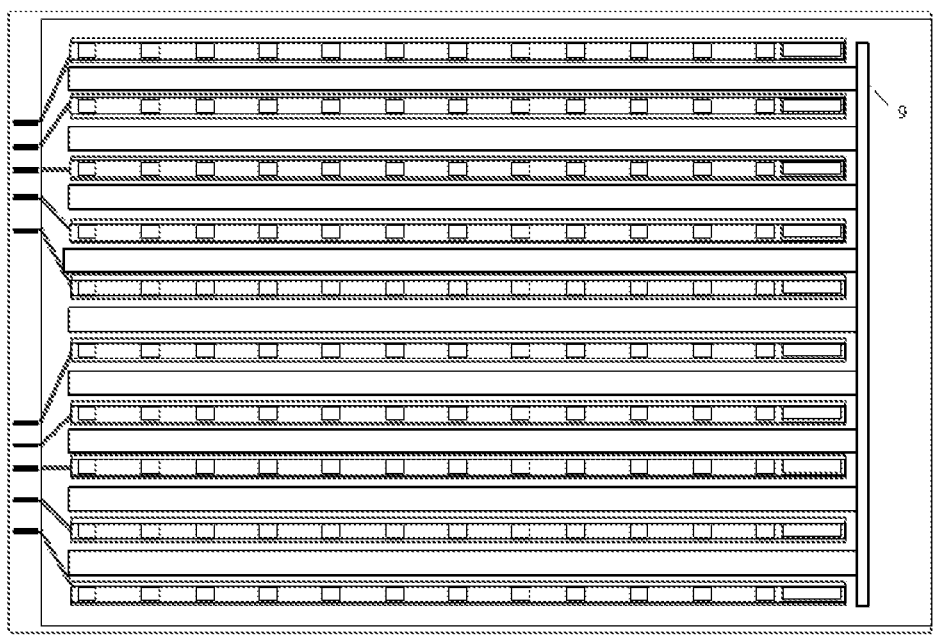
FIG. 9 is a seventh schematic diagram of a step-by-step structure of a display panel according to Embodiment 1 of the present disclosure.

In step S17, as shown in FIG. 9, a layer of hard material is deposited, and a support 9 is formed by a photolithography process. The position of the support 9 is on a region of the first substrate where the piezoelectric scanning lines and the first bonding electrodes are not formed. The function of the support 9 is to utilize the height difference between the support 9 and the connecting electrode on the piezoelectric scan line to ensure that the preset distance L1 between the connecting electrode and the juxtaposed second electrode and third electrode on the opposite, second substrate allows the height change of the piezoelectric material line under the action of the electric field to control the contact and separation of the connecting electrode and the juxtaposed second electrode and third electrode.

The material and the forming process of the support 9 are not limited. In some embodiments, the support 9 may be a transparent or opaque, hard, inorganic or organic film, the material of which is preferably one having small deformation in the direction perpendicular to the surface under action of external force or heat. The support 9 can be formed by chemical vapor deposition (CVD), plasma enhanced CVD (PECVD), or a photolithography process, or formed directly using a process including the organic film coating, exposure, development, and curing.

Figure 10:
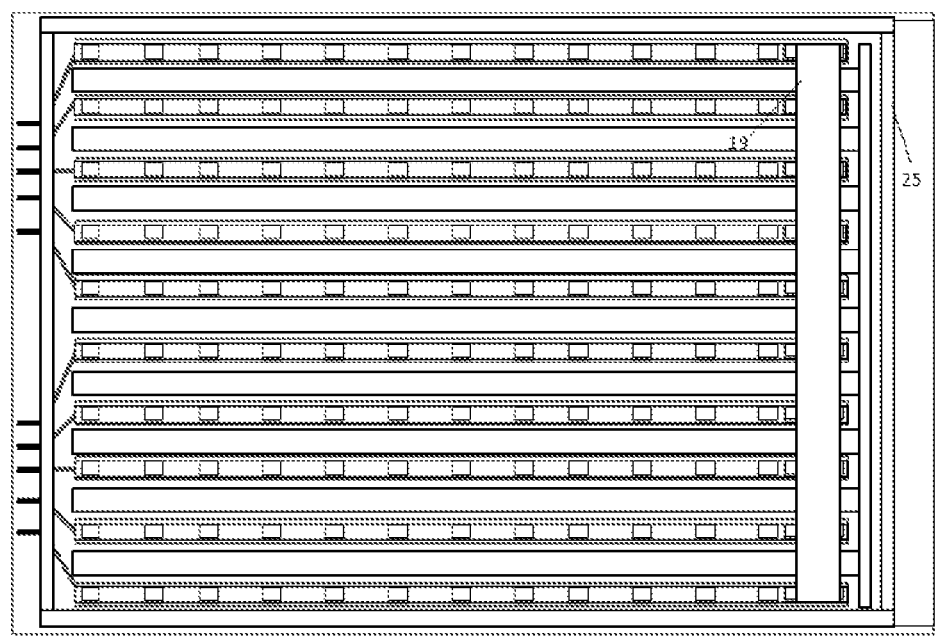
FIG. 10 is an eighth schematic diagram of a step-by-step structure of a display panel according to Embodiment 1 of the present disclosure.

In step S18, as shown in FIG. 10, a layer of conductive adhesive 19 is coated on the surfaces of the first reserved patterns covering the signal input terminals of the second metal scan lines. The width of the layer of conductive adhesive 19 does not exceed the width of the upper electrode signal input area, and the length thereof may cover the signal input terminals of all the second metal scan lines. The layer of conductive adhesive 19 may also be divided into multiple stages, respectively covering the signal input terminal of each second metal scan line.

The material of the conductive adhesive 19 not only has good conductivity, but also preferably has good elasticity and adhesiveness, and is used for transmitting common signals of the upper and lower substrates.

Afterwards, a sealant glue 25 is applied around the display area of the second substrate and is located on the inside of the first binding electrode for bonding with the first substrate.

The above steps S11 to S18 complete the process for preparing the lower substrate. A common signal (for example, 10V) from the upper substrate can be sent to the second metal scan line on each piezoelectric scan line, and form an electric field with the scan voltage loaded on the below first metal scan line (for example, +100V and −80V).

Under action of the electric field, the height (ie, thickness) of the piezoelectric material line changes according to the following formula:

$$U \times d_{33} = \pm 90V \times 2000 \text{ μm/V} = \pm 0.18 \text{ μm};$$

Wherein U is the potential difference on the piezoelectric material line; $d_{33}$ is the piezoelectric constant of the piezoelectric material, the first lower subscript "3" indicates the electric field component, and the second subscript "3" indicates the deformation component.

It should be noted that, in the above FIGS. 3-10, in order to simplify the description of the figures, only the corresponding reference numerals of the structures formed by the steps are emphasized in each figure. For the structures not

Embodiment 2

The piezoelectric scanning line in the above embodiment 1 has a single-layer piezoelectric structure and is limited by the piezoelectric coefficient of the existing piezoelectric material. The scanning drive signal required by the piezoelectric scanning line has a high voltage and consumes more power. In order to reduce the power consumption of the above display panel, the piezoelectric material in embodiment 1 described above may be changed from a single layer to multiple layers of piezoelectric materials stacked together in parallel. As such, the deformation at the same voltage will be increased by N times, where N is the number of stacked layers.

Figure 11:
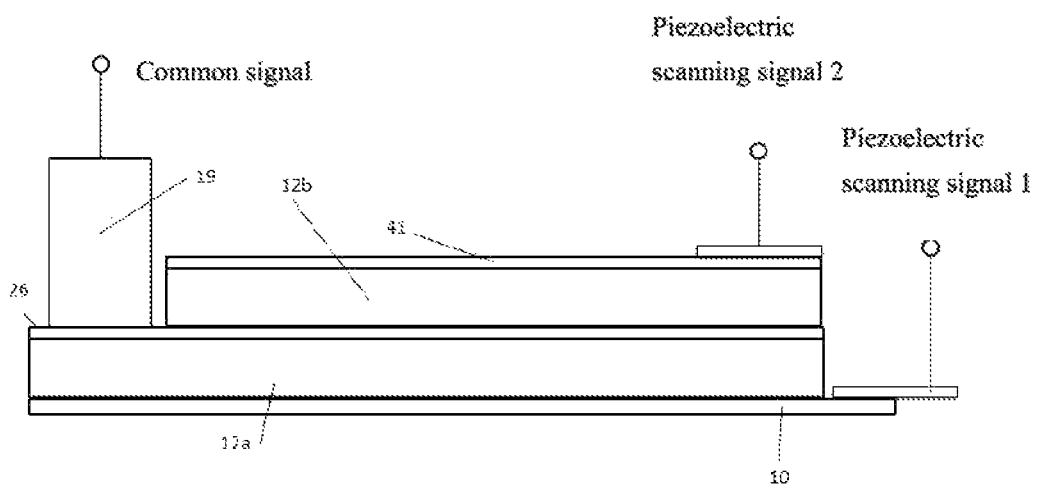
FIG. 11 is a schematic partial structural view of a display panel according to Embodiment 2 of the present disclosure.

In some embodiments, embodiment 2 of the present disclosure provides a structure of a piezoelectric material having two layers stacked together in parallel. The specific structure is shown in FIG. 11.

The piezoelectric material line may specifically includes a first piezoelectric material layer 12a disposed next to the first metal scan line 10 and a second piezoelectric material layer 12b disposed next to the second metal scan line 11. The direction of deformation of the first piezoelectric material layer 12a and that of the second piezoelectric material layer 12b are cumulative. The piezoelectric scanning line may further include an auxiliary electrode 26 disposed between the first piezoelectric material layer 12a and the second piezoelectric material layer 12b. The first piezoelectric material layer 12a and the first metal scanning line 10 expose part of the auxiliary electrode 26. The above display panel may further include a conductive adhesive 19 disposed on a partial area of the auxiliary electrode 26 for transmitting the common signal on the first substrate to the auxiliary electrode 26.

Here, the auxiliary electrode 26 is located between the upper layer of the first piezoelectric material layer 12a and the lower layer of the second piezoelectric material layer 12b, and is connected to the common electrode of the first substrate through the conductive adhesive 19 to serve as a common electrode of the upper and lower piezoelectric material layers for receiving common electrode signals (eg +10V).

It should be noted that the direction of deformation of the first piezoelectric material layer 12 a and the second piezoelectric material layer 12 b is cumulative, which means that when the first piezoelectric material layer 12a undergoes an increase in thickness in the electric field, the corresponding second piezoelectric material layer 12b also undergoes an increase in thickness in the electric field. Conversely, that the direction of deformation of the first piezoelectric material layer 12a and that of the second piezoelectric material layer 12b is cumulative means that when the first piezoelectric material layer 12a is deformed with a reduced thickness in the electric field, the corresponding second piezoelectric material layer 12b also undergoes a deformation with a reduced thickness in the electric field.

As shown in FIG. 11, the piezoelectric scan signal 1 and the piezoelectric scan signal 2 loaded on the first metal scan line 10 and the second metal scan line 11 respectively may be the same or different. The polarization directions of the first piezoelectric material layer 12a and the second piezoelectric material layer 12b can be determined according to the relationship between the applied piezoelectric scanning signals. When the direction of the piezoelectric scanning signal 1 and that of the piezoelectric scanning signal 2 are opposite, the polarization directions of the first piezoelectric material layer 12a and the second piezoelectric material layer 12b are the same to ensure the superposition of inverse piezoelectric deformation of the two piezoelectric materials. Conversely, when the directions of the piezoelectric scanning signal 1 and the piezoelectric scanning signal 2 are the same, the polarization directions of the first piezoelectric material layer 12a and the second piezoelectric material layer 12b are opposite to ensure the superposition of inverse piezoelectric deformation of the two piezoelectric materials. With the parallel stacking design described above, the amount of deformation under the same driving voltage can be doubled, thereby reducing the power consumption of the display panel.

The foregoing embodiments I and 2 provide a specific structure of a lower substrate, wherein the lower substrate refers to a first substrate and a corresponding structure disposed on the second substrate. For the sake of simplicity, the other substrate among the two substrates aligned in the display panel is referred to as an upper substrate, wherein the upper substrate refers to the second substrate and the corresponding structure disposed on the second substrate.

According to the specific display principle of the display panel, the upper substrate can be specifically an upper substrate of an OLED structure or an upper substrate used in an LCD.

In the following, the upper substrate of each structural type will be specifically explained through different embodiments.

Embodiment 3

Embodiment 3 of the present disclosure provides an upper substrate applied in an AMOLED display panel and a manufacturing process thereof.

The above switch unit can be used as a first-stage TFT of a sub-pixel, which is used to control an output current of a second-stage TFT in an OLED display panel. The second-stage TFT may be a conventional semiconductor TFT and disposed on the second substrate. In some embodiments, the specific structure of the upper substrate is as follows:

As shown in FIGS. 12 to 18, the above display panel further includes a plurality of switching signal lines 27 arranged in parallel on the second substrate 8. The surface of the switching signal line 27 facing the first substrate is located at the same level as the surface of the third electrode 3 facing the first substrate. Wherein, the orthogonal projection of the switching signal line 27 on the first substrate intersects the piezoelectric scan line to form an intersection region. A portion of the switching signal line 27 whose orthogonal projection on the plane where the piezoelectric scanning line is located overlaps the piezoelectric scan line serves as the second electrode 2. Each of the third electrodes 3 in any column of switching units is disposed between two adjacent switching signal lines 27.

Here, the intersecting region refers to an overlapping portion of an orthographic projection of the switching signal line 27 on the plane where the piezoelectric scanning line is located and the piezoelectric scanning line.

In some embodiment, the sub-pixel unit specifically includes an OLED component. The above display panel further includes a driving transistor (ie, a second-stage TFT) disposed on the second substrate 8 for driving the OLED component to emit light. The driving transistor includes a driving gate. The driving gate is the third electrode 3. That is, the third electrode 3 serves as an output terminal of the first-stage IP and a gate of the second-stage semiconductor TFT at the same time.

In some embodiment, the above OLED component specifically includes an OLED first electrode 28, a light emitting functional layer, and an OLED second electrode sequentially in the direction away from the second substrate 8. The OLED first electrode 28 of each OLED component is connected together to form a unitary OLED common electrode for loading common signals. The driving transistor further includes a driving source 30 and a driving drain 31 disposed opposite to each other, and a semiconductor layer 32 in contact with the driving source 30 and the driving drain 31. The above display panel further includes a first insulating layer 33 disposed on a surface of the OLED component; a plurality of parallel driving signal lines 35 disposed on the first insulating layer 33; a metal spacer 36 provided on the same layer and having the same thickness as the driving signal lines 35; a semiconductor spacer 37 disposed on the metal spacer 36; and a second insulating layer 38 covering the OLED components, the driving transistors, and the driving signal lines 35.

The first insulating layer 33 has first through holes 34 exposing the second electrodes of the OLED. Each driving signal line 35 corresponds to a column of OLED components. The driving drain 31 and the driving signal line 35 are disposed in the same layer and have the same thickness. The driving drain 31 is electrically connected to the second electrode of the OLED through a first through hole 34. The driving source 30 is a part of the driving signal line 35 directly opposite the driving drain 31. The metal spacer 36 and the driving drain 31 are located respectively on both sides of the driving signal line 35. The semiconductor spacer 37 and the semiconductor layer 32 are disposed in the same layer and have the same thickness. The switching signal lines 27 and the third electrodes 3 are disposed on the second insulating layer 38. The switching signal lines 27 have the same thickness as the third electrodes 3. The orthogonal projection of the switching signal line 27 on the second substrate 8 overlaps the orthogonal projection of the metal spacer 36 on the second substrate 8 and the orthographic projection of the semiconductor spacer 37 on the second substrate 8 respectively. The side of the support facing the second substrate 8 is in contact with the second insulating layer 38.

In some embodiments, on one hand, when the above-mentioned OLED first electrode 28 is specifically an anode, the opposite OLED second electrode is a cathode, and the OLED first electrodes 28 are connected together to form a common anode of a unitary structure. On the other hand, when the above-mentioned OLED first electrode 28 is specifically a cathode, the opposite OLED second electrode is an anode, and the OLED first electrodes 28 are connected together to form a common cathode of a unitary structure.

Furthermore, the role of the metal spacers 36 and the semiconductor spacers 37 is to make the lower surfaces of the second electrodes 2 opposite to the second substrate 8 and the lower surfaces of the third electrode 3 opposite to the second substrate 8 in the same horizontal plane. As such, when the thickness of the piezoelectric material increases by deformation, the second electrodes 3 and the third electrodes 3 can simultaneously contact the lower connecting electrodes disposed on the first substrate to turn on the above-mentioned switching unit.

In some embodiments, the OLED common electrode has a signal output terminal 39 for transmitting the loaded common signal to the first substrate. The above display panel further includes second metal wires 40 and second bonding electrodes 41 disposed on the second substrate 8 in the same layer as the drive signal lines 35. The driving signal lines 35 are disposed in the display area of the second substrate 8. The second metal wires 40 and the second bonding electrodes 41 are disposed outside the display area. The driving signal line 35 is electrically coupled to the second bonding electrode 41 through the second metal wiring 40. The second insulating layer 38 exposes the signal output terminal 39 on the aforementioned OLED common electrode, and the second insulating layer 38 has bonding through holes 42 exposing the second bonding electrodes 41.

Further, in the prior art, due to the leakage current of the first-stage TFT, it is necessary to design a storage capacitor having a large capacitance to ensure the gate bias (gate voltage) of the second-stage TFT. The large storage capacitance generally affects the aperture ratio of the pixel. In addition, the large storage capacitance requires the first-stage TFT to have a sufficiently large charging current to ensure the charging voltage.

In Embodiment 2 of the present disclosure, since the first TFT of the sub-pixel unit discards the semiconductor TFT in the prior art and uses the IPZT having the metal switch instead, it overcomes the problem of the leakage current caused by the semiconductor TFT in the prior art due to the material characteristics of the semiconductor active layer. Therefore, there is no need to design a storage capacitor with a large storage capacitance, and the storage capacitor can be designed to be smaller.

For example, the driving drain 31 and the third electrode 3 have an overlapping area (this area does not need to be too large) besides the area where the driving transistor is located. The driving drain 31, the second insulating layer 38, and the third electrode 3 in the overlapping area constitute the storage capacitor of each sub-pixel unit.

Figure 12:
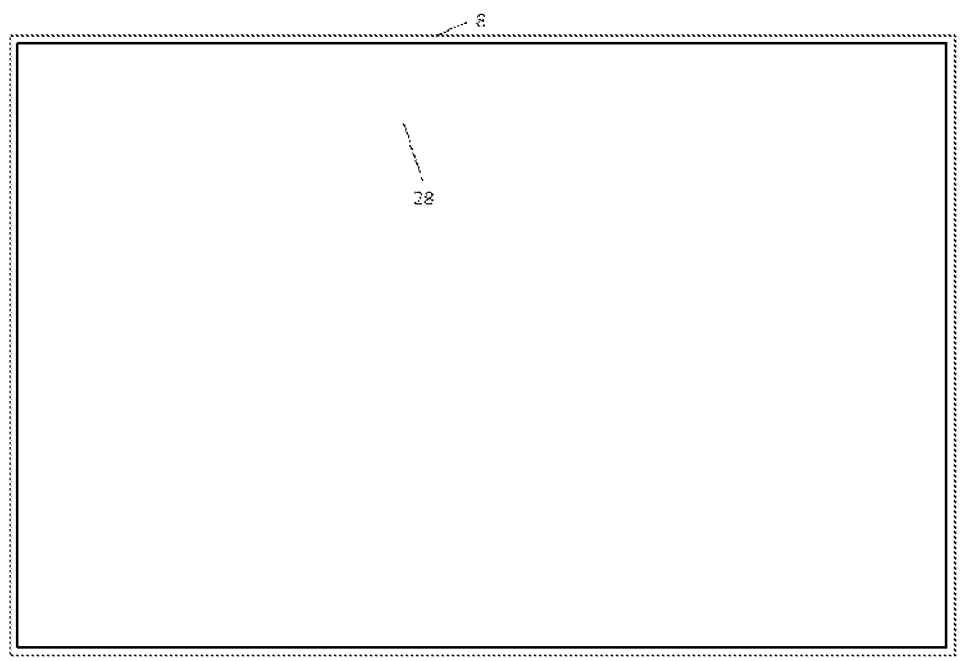
FIG. 12 is a first schematic diagram of a step-by-step structure of a display panel according to Embodiment 3 of the present disclosure.

In some embodiments, the process of preparing the upper substrate is as follows:

In step S21, as shown in FIG. 12, transparent conductive oxide such as indium tin oxide (ITO) is deposited on an entire surface of the second substrate 8 as an OLED common electrode 28. A common signal is loaded thereon, and the common signal is the same as the aforementioned common signal on the lower substrate (taking 10V as an example).

Figure 13:
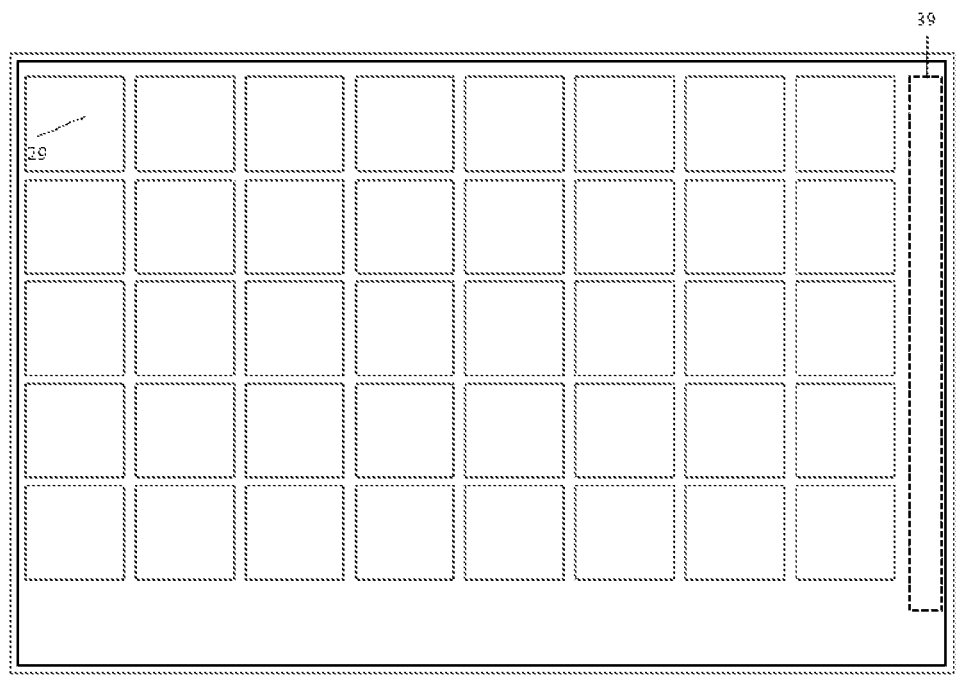
FIG. 13 is a second schematic diagram of a step-by-step structure of a display panel according to Embodiment 3 of the present disclosure.

In step S22, as shown in FIG. 13, a light emitting functional layer and an OLED second electrode made of a metallic material are formed on the formed OLED common electrode by processes such as evaporation, CVD, PVD, and photolithography, thereby forming an OLED component 29 as an organic RGB light emitting pixel.

The light-emitting functional layer may specifically include a hole transport layer HTL, an organic light-emitting layer EL, an electron transport layer ETL, and the like. The specific process and material composition for forming the OLED component 29 may follow the prior art, which is not limited in the embodiments of the present disclosure.

When the light emitting functional layer and the OLED second electrode are formed, a signal output terminal 39 corresponding to the upper electrode signal input area on the lower substrate is reserved on the OLED common electrode for transmitting the loaded common signal to the lower substrate.

Figure 14:
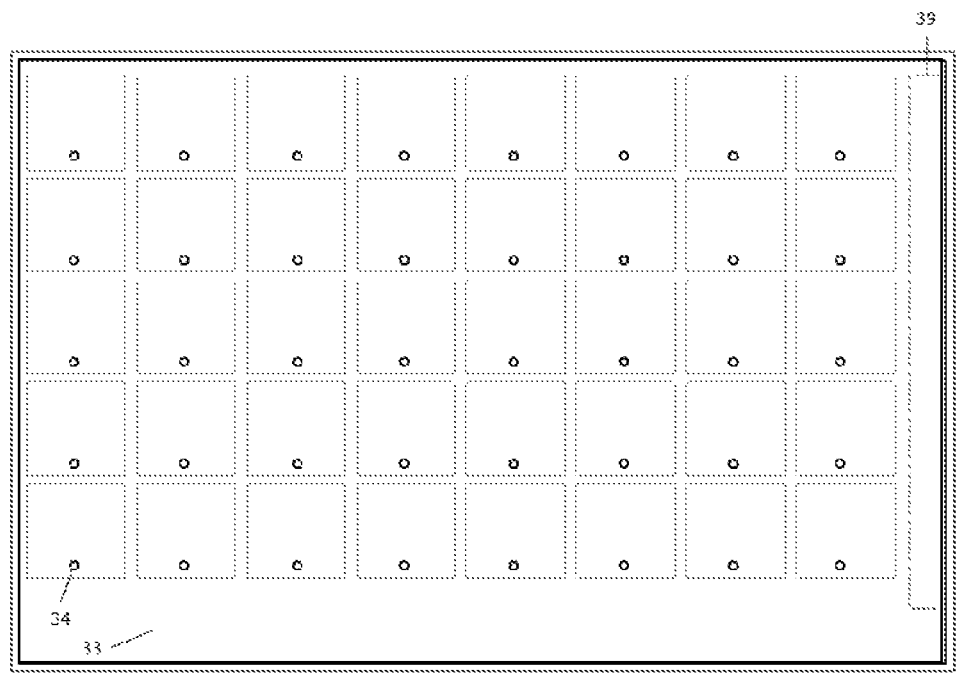
FIG. 14 is a third schematic diagram of a step-by-step structure of a display panel according to Embodiment 3 of the present disclosure.

In step S23, as shown in FIG. 14, a first insulating layer 33 is deposited on the second substrate, and a first through hole 34 exposing the OLED second electrode of the underlying OLED component is formed in each sub-pixel unit by, for example, a photolithography process.

Figure 15:
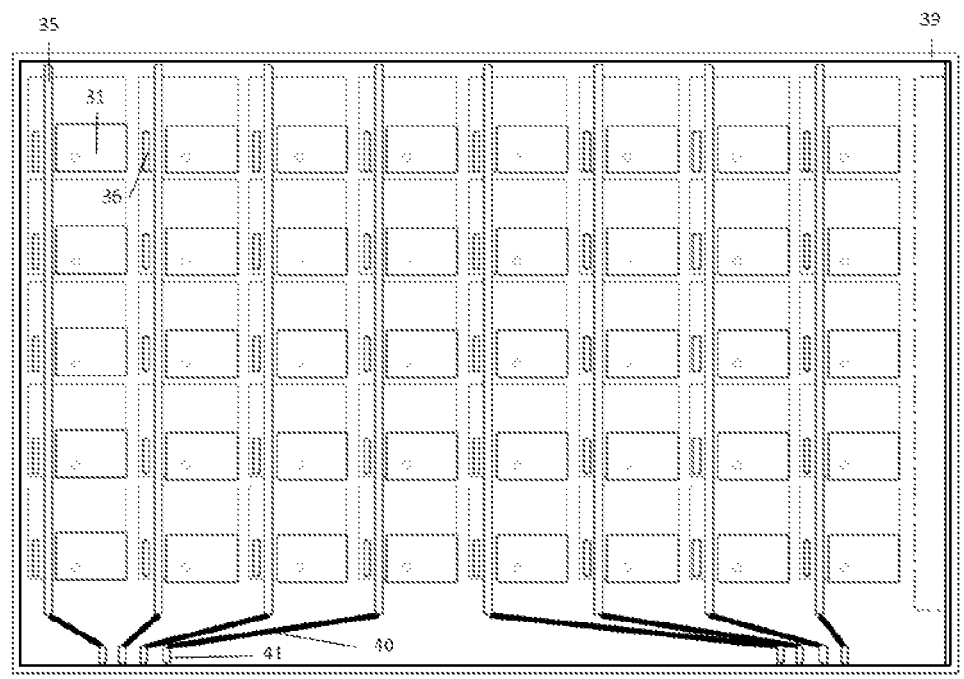
FIG. 15 is a fourth schematic diagram of a step-by-step structure of according to Embodiment 3 of the present disclosure.

In step S24, as shown in FIG. 15, patterns of driving signal lines 35, driving drains 31, second metal wires (ie, hub line area) 40, and second binding electrodes (in the IC binding area) 41 and metal spacers 36 disposed in the same layer may be formed on the surface of the first insulating layer by, for example, a metal film formation and a photolithography process. The driving drain 31 is electrically connected with the second OLED electrode below via the aforementioned first through hole.

Figure 16:
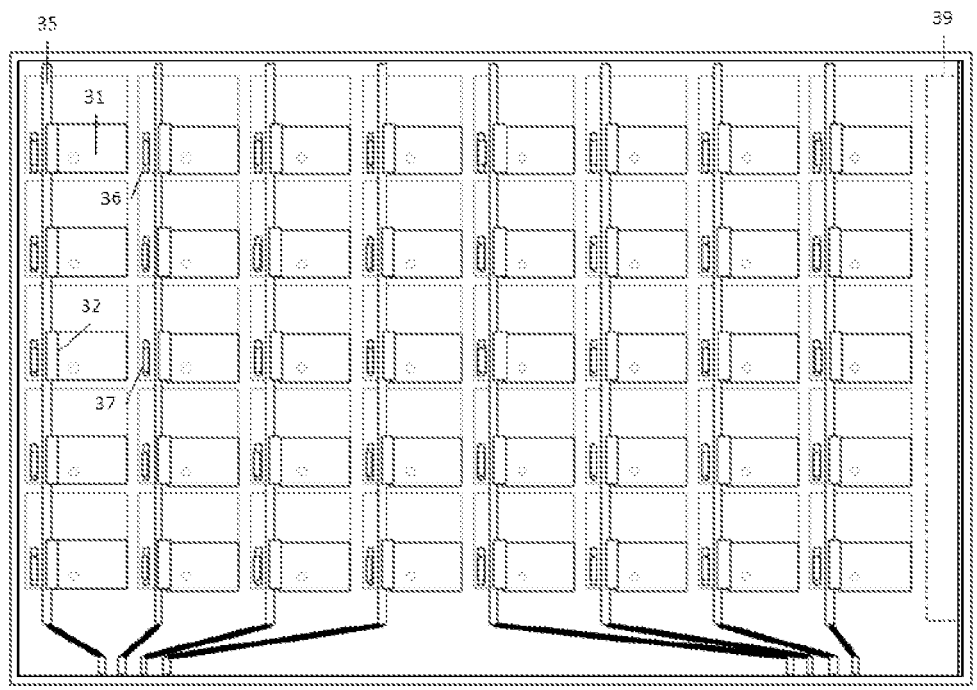
FIG. 16 is a fifth schematic diagram of a step-by-step structure of a display panel according to Embodiment 3 of the present disclosure.

In step S25, as shown in FIG. 16, a semiconductor layer 32 of the second-stage TFTs for driving pixels to emit light is formed by, for example, a semiconductor film formation and a photolithography process. The material thereof may be a semiconductor material with high mobility such as a metal oxide semiconductor or a low-temperature polysilicon to ensure that the second-stage TFT has a sufficiently high driving current density. At the same time, a portion of the semiconductor material is also retained as a semiconductor spacer 37 on the previously formed metal spacer 36 so that a sum of the heights of the metal spacer 36 and the semiconductor spacer 37 is the same as the height of the source and drain of the second-level driving TFT.

Figure 17:
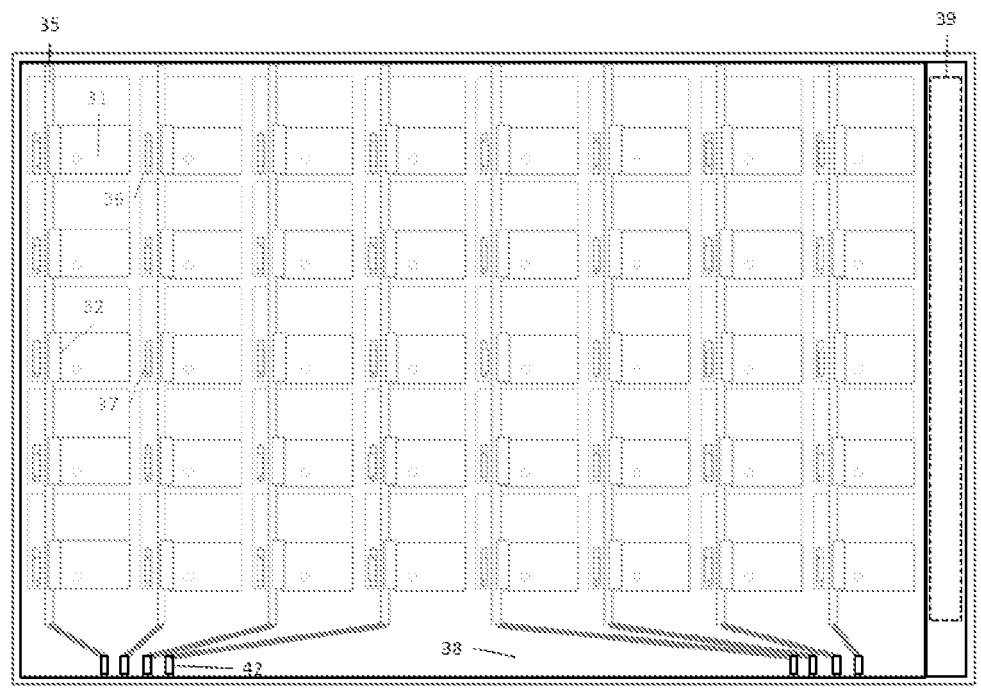
FIG. 17 is a sixth schematic diagram of a step-by-step structure of a display panel according to Embodiment 3 of the present disclosure.

In step S26, as shown in FIG. 17, a second insulating layer 38 is deposited on the previously formed structure. Bonding through holes 42 are formed at the positions of the second bonding electrodes of the driving signal lines 35 by a process such as exposure and dry etching for bonding the corresponding driver IC of the upper substrate. At the same time, the insulating layer above the signal output terminal 39 on the common electrode of the OLED is etched away to expose the underlying OLED common electrode.

Figure 18:
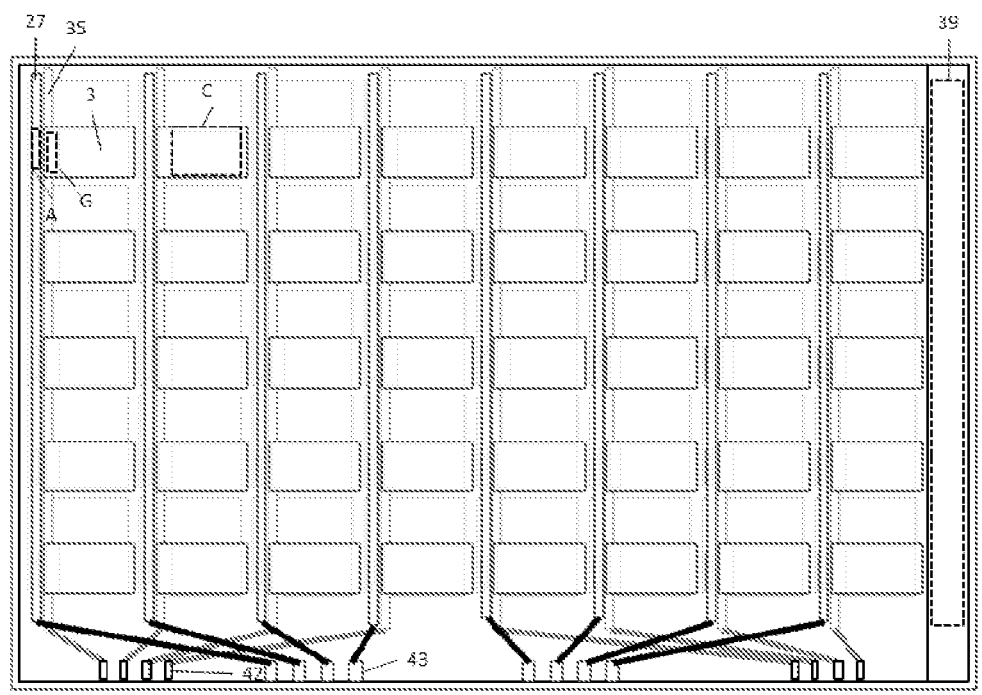
FIG. 18 is a seventh schematic diagram of a step-by-step structure of a display panel according to Embodiment 3 of the present disclosure.

In step S27, as shown in FIG. 18, patterns of switching signal lines (that is, address signal lines) 27, third metal lines (that is, a hub), and third bonding electrodes 43 (in the IC bonding region) and the third electrodes 3 (that is, the addressing TFT metal drain) spaced from the switching signal lines 27 by, for example, about 4 μm to about 5 μm are formed, for example, by a metal film formation and photolithography process. At the same time, the metal drain serves as the gate and forms a second-stage driving TFT with the below driving signal lines 35, the semiconductor layer, the driving drain 31, and the second insulating layer 38 (that is, the driving gate insulating layer).

The switching signal lines 27 cover the metal spacers 36 and the semiconductor spacers 37. As such, There is no height difference between the area of the switching signal line 27 on the overlapped position of the spacers (labeled as A in FIG. 18) and the third electrode 3 above the driving source and the driving drain as the gate of the driving TFT (labeled as G in FIG. 18).

The driving drain and the third electrode 3 have an overlapping area besides the area where the driving transistor is located. The drive drain, the second insulating layer, and the third electrode 3 in the overlapping area constitute the storage capacitor of each sub-pixel unit (labeled C in FIG. 18).

The upper substrate and the lower substrate after the above processes are aligned and bonded. In the structure of the bonded display panel, the projections of the second electrode and the third electrode of the upper substrate on the plane of the connecting electrode of the lower substrate overlap with the connecting electrode. As such, under the electric field formed between the first electrode and the fourth electrode, the thickness of the piezoelectric material layer can be increased so that the conecting electrode is in contact with the second electrode and the third electrode. The top of the support formed on the first substrate touches the second insulating layer covering the surface of the OLED second electrode of the OLED component to maintain the preset distance L1 between the second electrode/the third electrode and the connecting electrode.

Here, the position of the upper electrode signal input area on the lower substrate coincides with that of the signal output terminal on the upper substrate. The upper and lower substrates are vacuum sealed by the sealant on the lower substrate. The first substrate has a scan driving circuit binding area outside the display area for disposing the scan driving circuit. The second substrate has a data driving circuit binding area outside the display area for disposing the data driving circuit. After bonding, the first bonding electrodes located on the first metal scan lines in the IC binding area are exposed from the lower substrate side for loading the scan signal. The third bonding electrodes located on the switching signal lines in the IC binding area are exposed from the upper substrate for loading the data signal.

The following further describes the matching structure in the pixel area after bonding.

Figure 19:
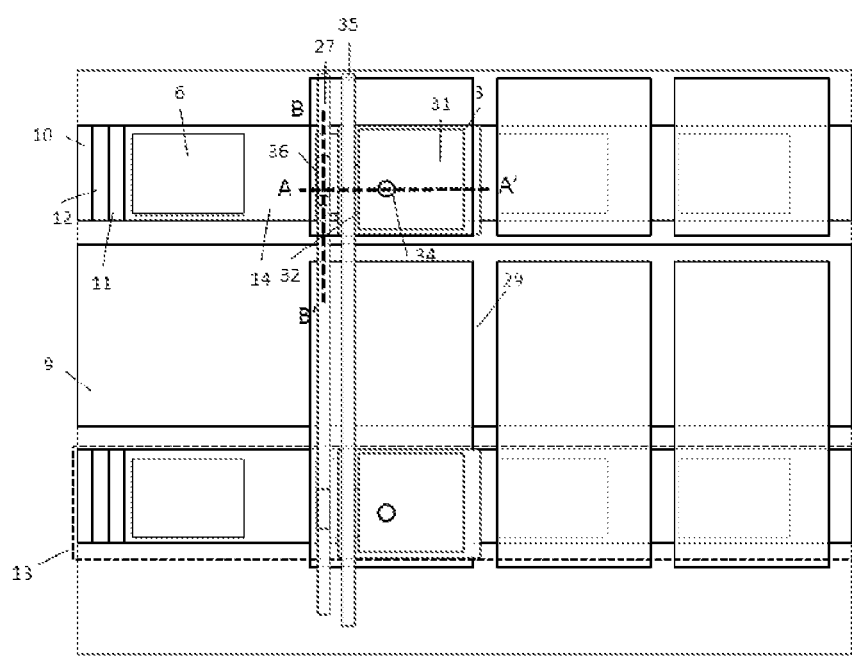
FIG. 19 is a schematic partial structural view of a display panel after binding according to Embodiment 3 of the present disclosure.
Figure 20:
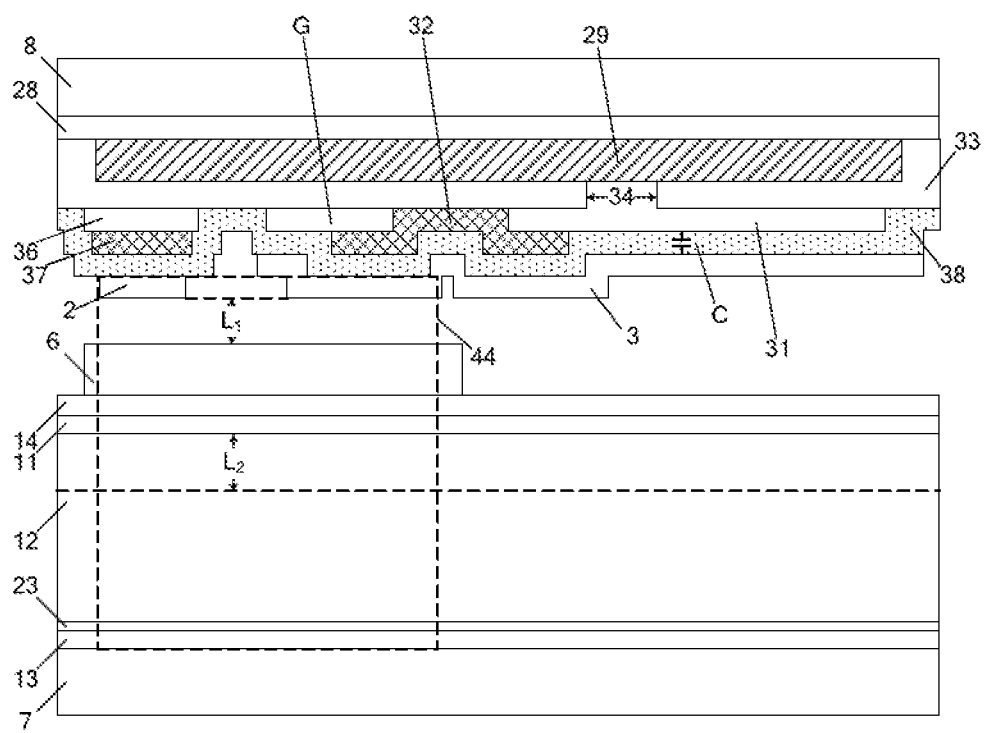
FIG. 20 is a schematic sectional view along line AA' in FIG. 19.

As shown in FIGS. 19 and 20, the piezoelectric scanning line 13 on the first substrate 7 controls the height increase and decrease of the piezoelectric material line 12 through the electric field between the first metal scan line 10 and the second metal scan line 11 with an amount of variation of L2. For example, if the amount of variation L2 is ±0.18 μm, the total height variation is 0.36 μm. After the upper substrate is bond with the lower substrate, the connecting electrode 6 on the lower substrate including the piezoelectric scanning line 13 and the second electrode 2/the third electrode 3 on the upper substrate form an inverse piezoelectric addressing switch, namely IPZT44. The distance between the top of the connecting electrode 6 and the bottoms of the second electrode 2 and the third electrode 3 is the preset distance L1. L1 is smaller than the height increase (0.18 μm) of the piezoelectric material line 12 under the on-state scanning signal. Here, for example, L1=0.15 μm.

When the scanning line signal on the first metal scan line is in "on" state, the connecting electrode 6 on the lower substrate is raised 0.18 μm so that the connecting electrode 6 simultaneously contacts the bottoms of the second electrode 2 and the third electrode 3 on the upper substrate. As such, the address signal on the switching signal line is applied to the gate of the driving TFT, and the third electrode 3 and the driving drain 31 form a storage capacitor (marked as C in FIG. 20).

At this time, the channel on the semiconductor layer 32 of the driving TFT is turned on by the influence of the address signal. As such, the driving current is loaded from the driving signal line 35 to the driving drain 31. Furthermore, the driving signal is loaded to the OLED second electrode of the OLED component through the first through hole 34 and form a conduction current between the second electrode and the OLED common electrode 28 so that the OLED component emits light.

When the scanning line signal on the lower substrate is in the off state, the piezoelectric material line 12 on the lower substrate is decreased in height by 0.18 μm from the original thickness. At this time, the distance between the connecting electrode 6 on the lower substrate and the highest metal point of the upper substrate, that is, the lower surfaces of the second electrode 3 and the third electrode 3 is increased to 0.15+0.18=0.33 sm. The second electrode 2 and the third electrode 3 are completely disconnected, and the pixel relies on the charge stored in the storage capacitor to maintain the gate voltage of the driving TFT, so that the driving TFT is kept open, thereby maintaining the light emitting state of the OLED component until the next address signal input. Since there is no leakage current between the addressing source and the addressing drain (that is, the second electrode and the third electrode), the charge of the storage capacitor is not released, so that the gate voltage of the driving TFT can be kept constant.

Figure 21:
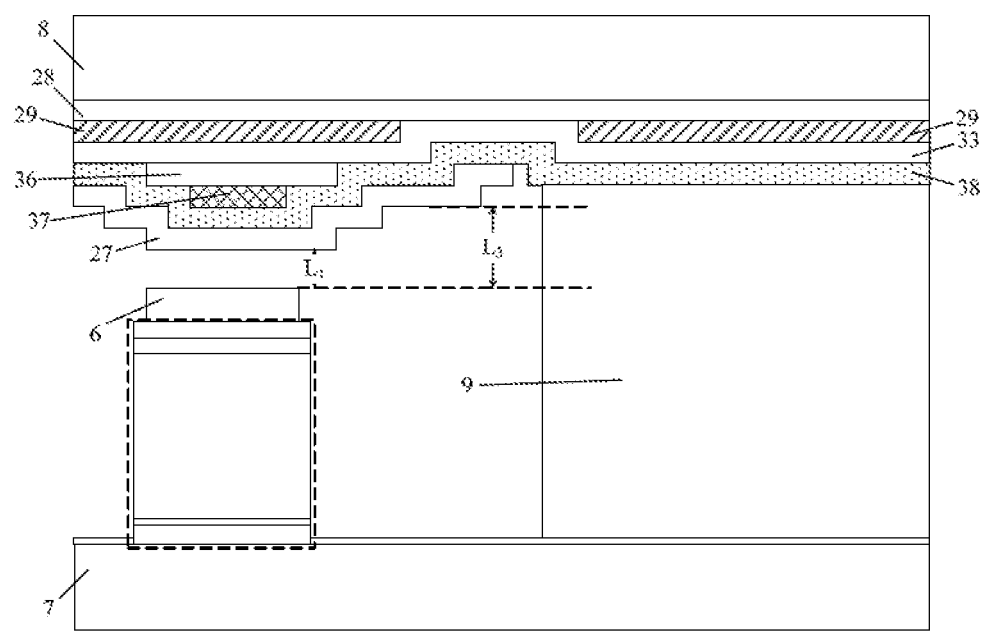
FIG. 21 is a schematic sectional view along line BB' of FIG. 19.

As shown in FIG. 21, the preset distance L1 between the second electrode 2/the third electrode 3 and the lower connecting electrode 6 is determined by the height difference L3 between the support 9 on the lower substrate and the connecting electrode 6 and the thickness difference between the driving metal and the semiconductor layer on the upper substrate. By adjusting the height of the support 9, a desired distance L1 in an IPZT can be obtained.

Finally, the bond panel is cut and the cutting edge is polished to obtain the panel. Then, the new type of IPZT-AMOLED display apparatus can be prepared by binding the scanning IC, the data IC, and the external circuit.

It should be noted that, in the above FIGS. 12-21, in order to simplify the description of the figures, only the corresponding reference numerals of the structures formed by the steps are emphasized in each figure, and for the structures not marked with the reference numerals in the figures, specific marks may be found in the figures of the previous steps.

Embodiment 4

Embodiment 4 provides a specific structure of an upper substrate used in a Passive Matrix OLED (PMOLED) display panel and a manufacturing method thereof. Compared with the foregoing embodiment 3, the upper substrate cancels the address signal line, replaces the IPZT with the first-stage TFT, and is bond with the same lower substrate as that of the previous embodiment.

Figure 22:
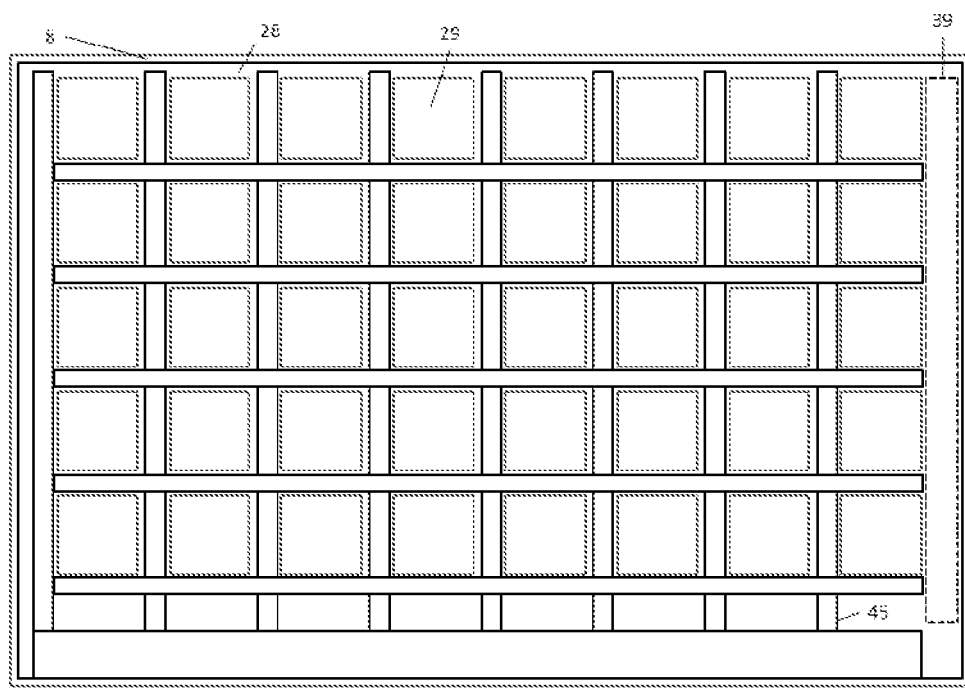
FIG. 22 is a first schematic diagram of a step-by-step structure of a display panel according to Embodiment 4 of the present disclosure.
Figure 23:
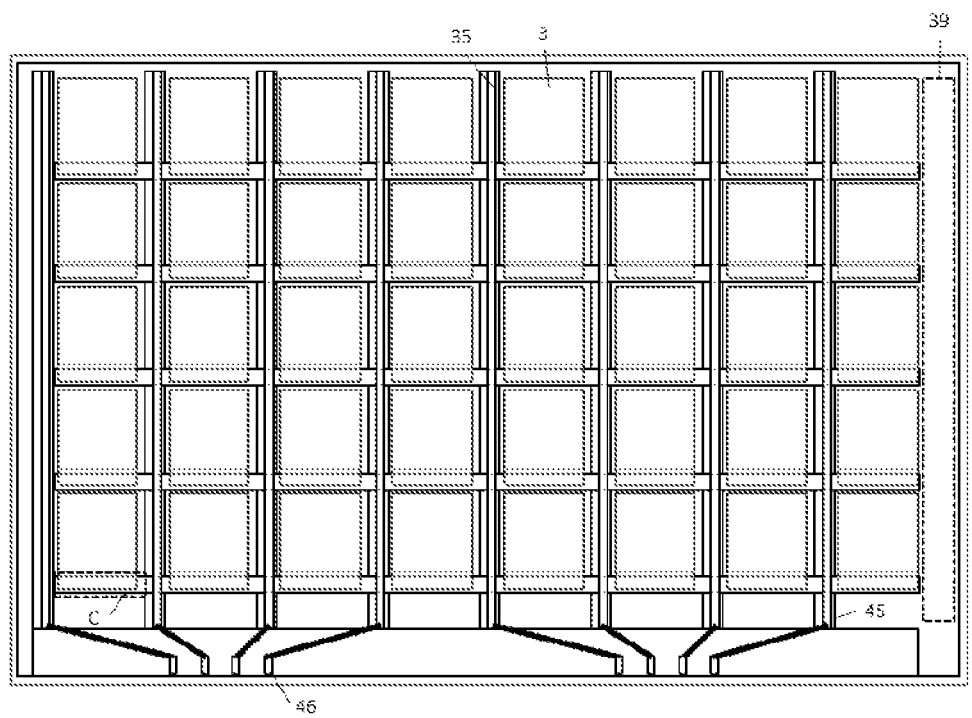
FIG. 23 is a second schematic diagram of a step-by-step structure of a display panel according to Embodiment 4 of the present disclosure.

In some embodiments, as shown in FIGS. 22 and 23, a plurality of driving signal lines 35 are arranged in parallel on the second substrate 8. The surface of each of the driving signal lines 35 facing the first substrate is located at the same level as the surface of the third electrode 3 facing the first substrate. An orthogonal projection of the driving signal line 35 on the plane where the piezoelectric scan line is located intersects the piezoelectric scan line. The second electrode 2 is an area of the driving signal line 35 whose orthogonal projection overlaps the piezoelectric scanning line. The third electrodes 3 of any column of the switching units are disposed between two adjacent driving signal lines 35. Here, the intersecting area refers to an overlapping portion between the orthogonal projection of the drive signal line 35 on the plane where the piezoelectric scan line is located and the piezoelectric scan line.

The above sub-pixel unit includes an OLED component 29. The OLED component 29 includes an OLED first electrode 28, a light emitting functional layer, and an OLED second electrode which are sequentially disposed in the direction away from the second substrate 8. The third electrode 3 is disposed on the side of the OLED second electrode opposite from the second substrate 8, that is, the third electrode 3 serves as the output of the first-stage IPZT and the driving electrode of the OLED second electrode in the OLED component 29. The OLED first electrode 28 of each OLED component 29 is connected together to form a unitary OLED common electrode 28.

The above display panel further includes an insulating spacer 45 having the same thickness as the OLED component 29 disposed on the second substrate 8. The insulating spacer 45 is disposed at least between two adjacent columns of OLED components. The driving signal line 35 is disposed on the insulating spacer 45, and the driving signal line 35 and the third electrode 3 have the same thickness so that the lower surfaces of the second electrode 2 and the third electrode 3 are at the same level, which can simultaneously contact the connecting electrode 6 below.

In some embodiments, the upper substrate can be prepared as follows:

The OLED components 29 as organic RGB light-emitting pixels are formed using steps S21 and S22 in the foregoing embodiment 3. After this, the method continues as follows:

As shown in FIGS. 22 and 23, on areas on the second substrate 8 other than the OLED components 29 and the signal output terminals of the OLED first electrodes, insulating spacers 45 which are non-conductive and have a high dielectric constant are formed, for example, by a film formation and photolithography process. The height of the insulating spacer is consistent with that of the OLED component 29 to ensure that the insulating spacer 45 is at the same level with the upper surface of the OLED second electrode of the OLED component 29 (ie, the surface opposite from the second substrate 8).

Then, a metal layer is further formed on the insulating spacer 45 and the OLED surface, for example, by a metal film formation and photolithography process. The driving signal lines 35 on the insulating spacer 45 for loading driving signal, the hub area, the fourth bonding electrodes (ie, the signal input terminal) 46 and the third electrodes 3 (ie, OLED second driving electrode) are respectively formed. The third electrode is also the OLED second metal electrode on the surface of the organic light emitting pixel. At the same time, the upper and lower pixel electrodes and the insulating spacer 45 can also form the storage capacitor of each pixel (marked as C in the FIG. 23).

Finally, the prepared upper substrate and the aforementioned lower substrate are aligned and bond. Since the orthogonal projections of the second electrode and the third electrode of the upper substrate on the plane of the connecting electrode of the lower substrate overlap the connecting electrode, under the action of the electric field formed between the first electrode and the fourth electrode, the thickness of the piezoelectric material layer is increased so that the connecting electrode is in contact with the second electrode and the third electrode. At this time, the position of the upper electrode signal input area on the lower substrate coincides with the position of the signal output terminal area on the upper substrate. The upper and lower substrates are vacuum sealed by the sealant on the lower substrate. The first substrate has a scan driving circuit binding area outside the display area for disposing the scan driving circuit. The second substrate has a data driving circuit binding area outside the display area for disposing the data driving circuit. After bonding, a first bonding electrode located on the first metal scan line in the IC binding area is exposed from the lower substrate side for loading the scan signal. A fourth bonding electrode located on the driving signal line in the IC binding area is exposed from the upper substrate side for loading the data signal.

In some embodiments, the following describes the matching structure in the pixel area after binding.

Figure 24:
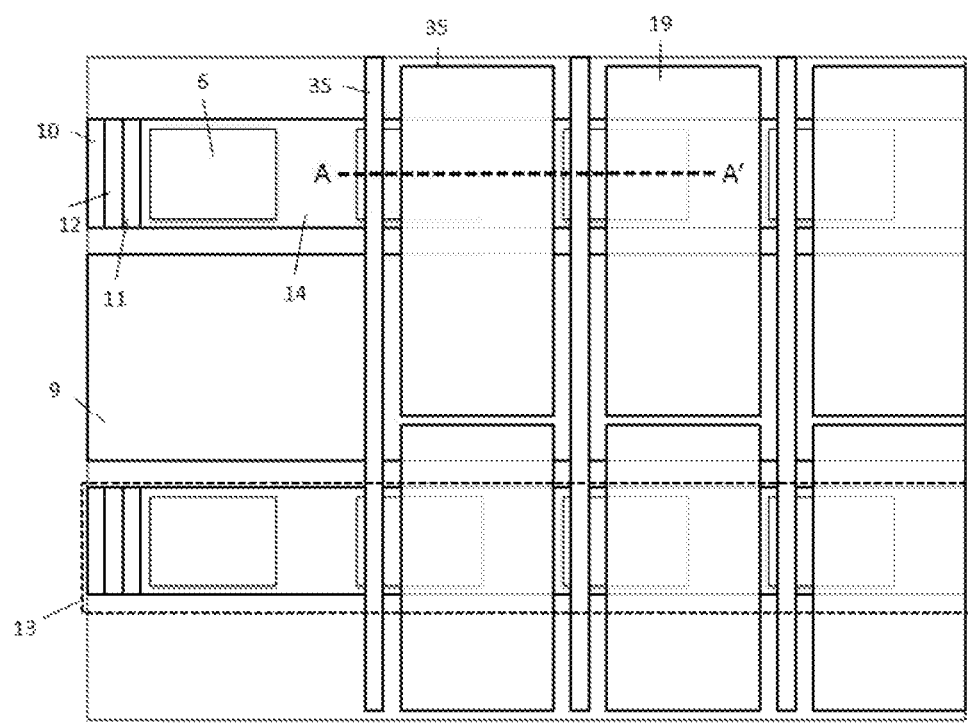
FIG. 24 is a schematic partial structural view of a display panel after binding according to Embodiment 4 of the present disclosure.
Figure 25:
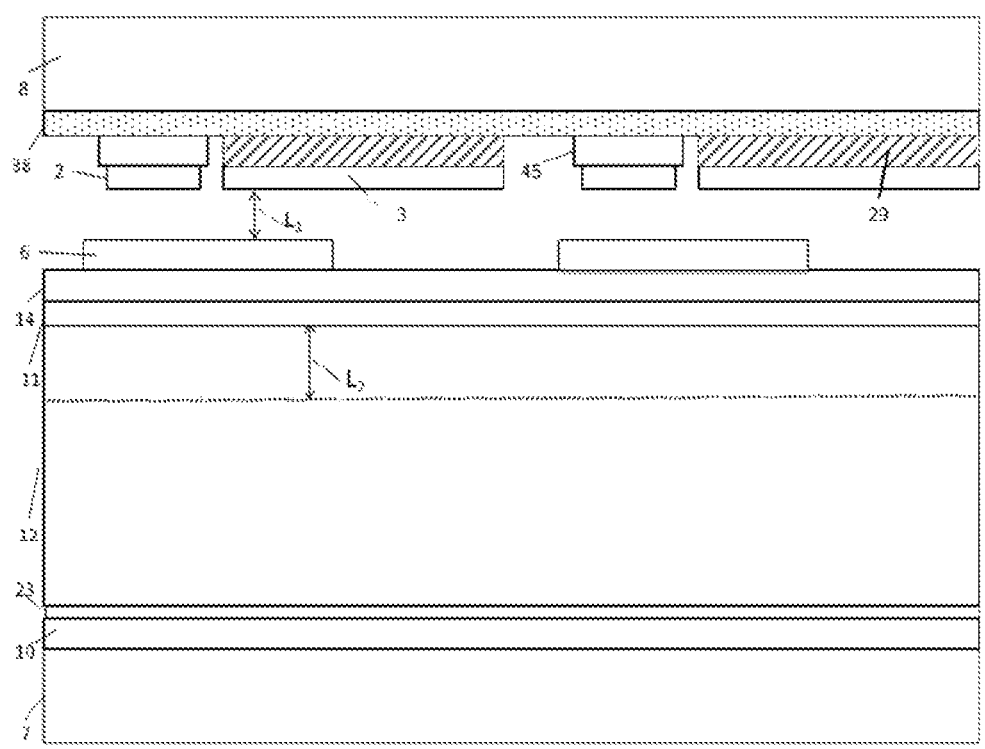
FIG. 25 is a schematic sectional view along line AA' in FIG. 24.

As shown in FIGS. 24 and 25, the piezoelectric scanning line 13 on the first substrate 7 controls the height increase and decrease of the piezoelectric material line 12 through the electric field between the first metal scan line 10 and the second metal scan line 11 with an amount of variation L2. For example, L2 may be $\pm 0.18$ μm, and the total height variation is 0.36 μm. After the upper substrate is bond with the lower substrate, the connecting electrode 6 on the lower substrate including the piezoelectric scanning line 13 and the second electrode 2 and the third electrode 3 on the upper substrate form an inverse piezoelectric addressing switch, namely IPZT44. The distance between the top of the connecting electrode 6 and the bottom of the driving signal line 35 (ie, the second electrode) and the bottom of the driving electrode of the OLED second electrode, ie, the third electrode 3, is preset distance L1. It is required that L1 is smaller than the height increase (0.18 μm) of the piezoelectric material line 12 under the on-state scanning signal. For example, L1=0.15 μm. L1 depends on the difference between the height of the spacer 9 on the lower substrate and the height of the connecting electrode 6. Similar to the principle of the foregoing embodiment 3, L1 is required to be smaller than the height increase of the piezoelectric material under the on-state scanning signal. For example, L1 is 0.15 μm.

When the scanning line signal on the first metal scan line is in the on state, the connecting electrode 6 on the lower substrate is raised 0.18 μm so that the connecting electrode 6 simultaneously contacts the bottoms of the second electrode 2 and the third electrode 3 on the upper substrate. As such, the data signal on the driving signal line 35 is loaded on the OLED second electrode, and form an conduction current with the OLED first electrode 28 of the OLED component 29 so that the OLED component 29 emits light.

When the scanning line signal of the lower substrate is in the off state, the piezoelectric material line 12 on the lower substrate is decreased in height by 0.18 μm from the original thickness. At this time, the distance between the connecting electrode 6 on the lower substrate and the highest metal point of the upper substrate, ie, the lower surfaces of the second electrode 2 and the third electrode, is increased to 0.15+0.18=0.33 μm. The second electrode 2 is completely disconnected from the third electrode 3, that is, the driving signal line 35 is completely disconnected from the OLED second electrode of the OLED component. The OLED component 29 continues to emit light by virtue of the charge stored in the storage capacitor (labeled C in the figure).

It should be noted that, in the above FIGS. 22-25, in order to simplify the description of the figures, only the corresponding reference numerals of the structures formed by the steps are emphasized in each figure, and for the structures not marked with the reference numerals in the figures, specific marks may be found in the figures of the previous steps.

Embodiment 5

The above-mentioned inverse piezoelectric switch provided by the embodiments of the present disclosure can also be applied to a TFT-LCD product. The following provides a specific structure of an upper substrate used in an LCD and a manufacturing method thereof according to some embodiments of the present disclosure.

As shown in FIGS. 26-33, the sub-pixel unit includes a pixel electrode 47 electrically coupled to the third electrode 3. The above display panel further includes a color film substrate 48, a liquid crystal layer 49, and a common electrode 50. The color film substrate 48 is disposed on the side of the second substrate 8 opposite from the first substrate 1. The liquid crystal layer 49 is disposed between the color film substrate 48 and the second substrate 8. The common electrode 50 is disposed on the side of the second substrate 8 facing the liquid crystal layer 49, or the common electrode 50 is disposed on the color film substrate 48.

In some embodiments, the display panel further includes common signal wires 51 disposed on the second substrate 8 and in the same layer as the pixel electrode 47. Height spacers 53 are disposed in the same layer as the common signal wires 51. A third insulating layer is disposed on the pixel electrodes 47, the common signal wires 51, and the first electrodes 52 of the storage capacitors.

The first electrode 52 of the storage capacitor corresponding to each pixel electrode 47 is extended from the common signal wire 51. The third insulating layer has through holes 54 exposing the pixel electrodes 47. The foregoing switching signal lines 27 and the third electrodes 3 are disposed on the third insulating layer. The orthogonal projection of the switching signal line 27 on the second substrate 8 overlaps the orthogonal projection of the aforementioned height spacer 53 on the second substrate 8. The orthogonal projection of the third electrode 3 on the second substrate 8 overlaps the orthogonal projection of the first electrode 52 of the storage capacitor on the second substrate 8. The third electrode 3 is electrically coupled to the pixel electrode 47 through the aforementioned through hole 54. The pixel electrode 47, the common signal wire 51, and the first electrode 52 of the storage capacitor have the same thickness. The switching signal line 27 and the third electrode 3 have the same thickness.

Here, the third electrode 3, the overlapping portion of the first electrode 52 of the storage capacitor, and the insulating medium (ie, a third insulating layer) therebetween constitutes a storage capacitor.

In some embodiments, the display panel further includes signal output lines 55 on the second substrate 8 for connecting the common signal wires 51. The signal output lines are for transmitting the loaded common signal to the first substrate.

Figure 26:
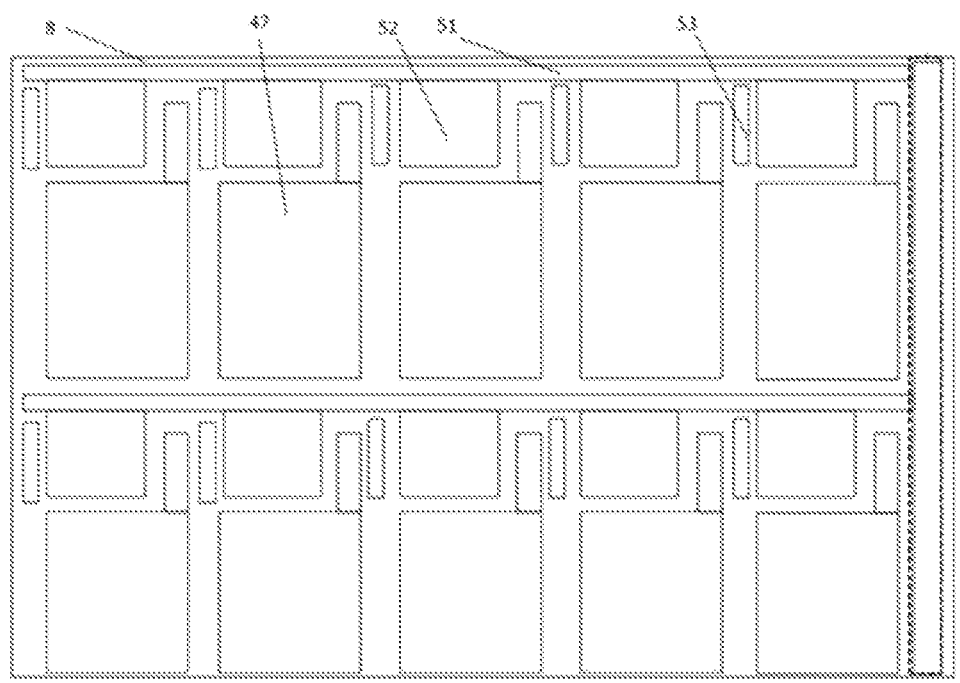
FIG. 26 is a first schematic diagram of a step-by-step structure of a display panel according to Embodiment 5 of the present disclosure.

In some embodiments, the upper substrate is prepared by the method below:

In step S41, as shown in FIG. 26, pixel electrodes 47, common signal wires 51, first electrodes 52 of storage capacitors, height spacers 53, and signal output lines 55 are formed on the second substrate 8, for example, by a process including deposition of ITO and photolithography.

The first electrode 52 of the storage capacitor is a structure extending from the common signal wire 51 and corresponding to each pixel electrode 47. The height spacer 53 is used to keep the height of the film layer above to be consistent with the height of the film layer above the first electrode 52 of the storage capacitor. The position of the signal output line 55 overlaps the position of the signal input terminal of the second metal scan line on the first substrate after binding for transmitting the loaded common signal to the aforementioned first substrate.

Figure 27:
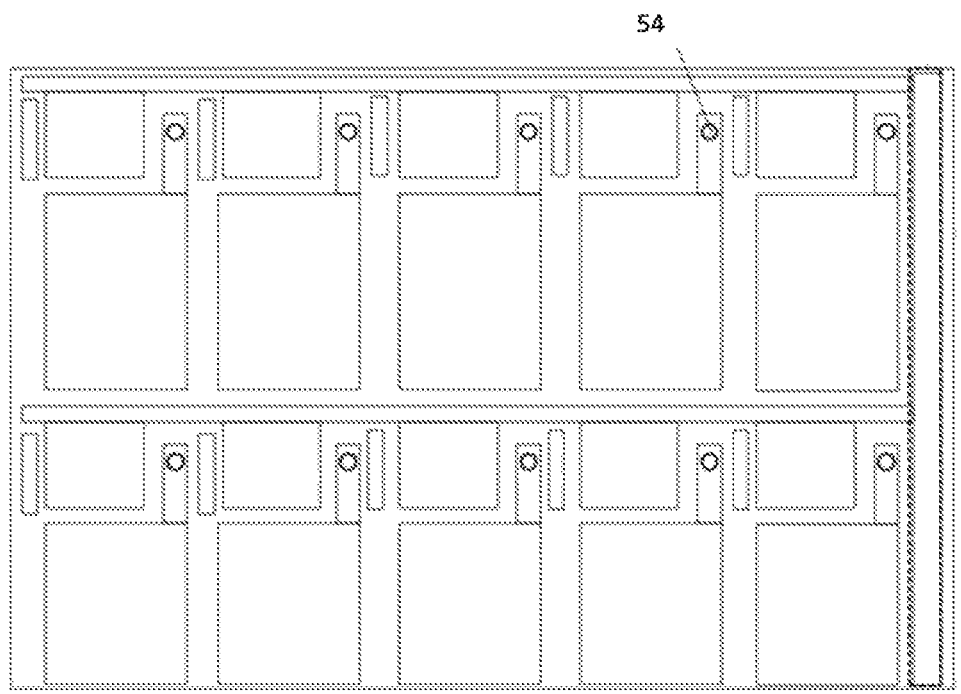
FIG. 27 is a second schematic diagram of a step-by-step structure of a display panel according to Embodiment 5 of the present disclosure.

In step S42, as shown in FIG. 27, a third insulating layer is deposited on the substrate formed in the previous step by, for example, a CVD process. Through holes 54 exposing pixel electrodes underneath are then formed on the third insulating layer, for example, by a photolithography process for loading a pixel signal to the pixel electrode. Moreover, the third insulating layer exposes the signal output lines 55 below, that is, the portion of the third insulating layer corresponding to the signal output lines 55 is also etched and exposed.

Figure 28:
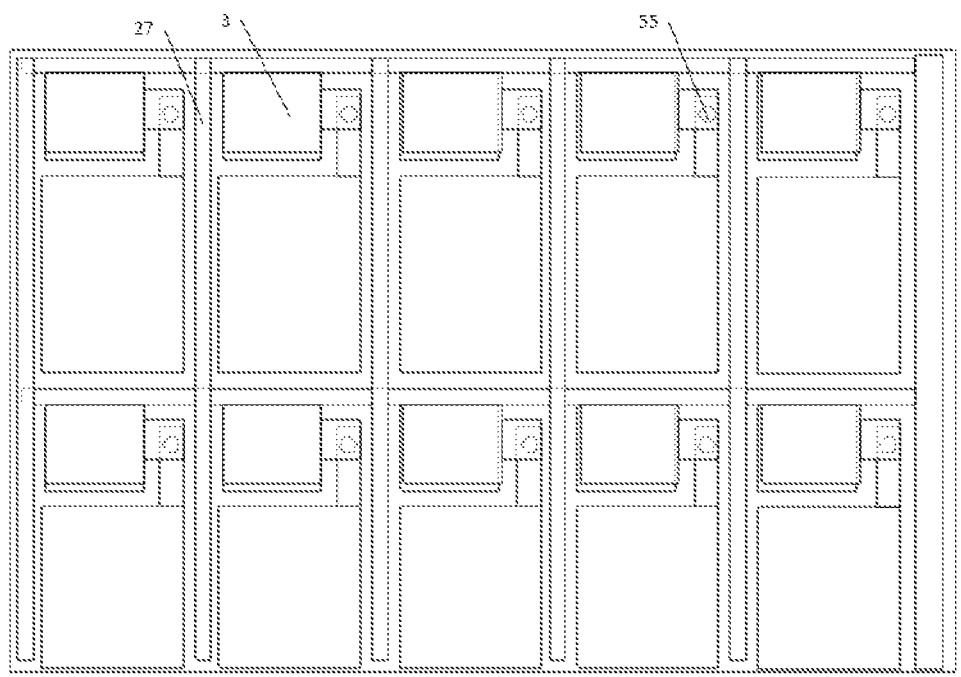
FIG. 28 is a third schematic diagram of a step-by-step structure of a display panel according to Embodiment 5 of the present disclosure.

In step S43, as shown in FIG. 28, the switching signal line 27 and the third electrode 3 are formed on the third insulating layer using, for example, film formation and photolithography processes. At the same time, the third electrode 3, the overlapping portion of first electrode 52 of the below storage capacitor, and an insulating medium therebetween (that is, the third insulating layer) constitute a storage capacitor.

Here, the switching signal line 27 serves as a data input signal line. The third electrode 3 corresponds to a drain and is electrically coupled to the pixel electrode below via the through hole 55 to load the signal on the pixel electrode.

Then, the upper and lower substrates are aligned and bond. The second electrode and the third electrode on the upper substrate correspond to the source and the drain of the TFT respectively. The connecting electrode on the lower substrate corresponds to the channel when the TFT is turned on.

In some embodiments, the matching structure in the pixel region after binding will be further described below.

For the principle of the switch unit achieving turn-on and turn-off of the signal through the contact and open circuit between the metal electrodes, reference may be made to the foregoing embodiments, and is not repeated here.

Figure 29:
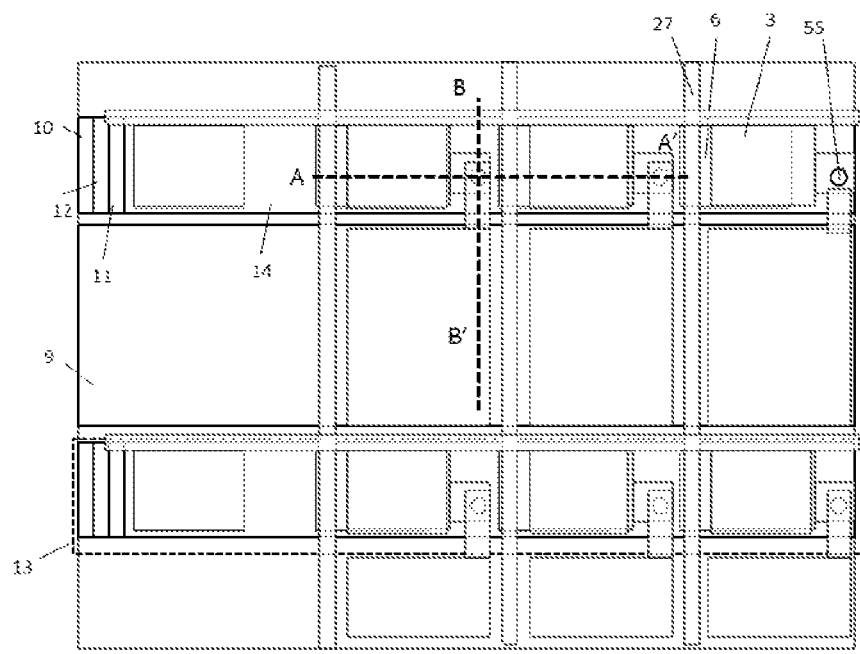
FIG. 29 is a schematic partial structural view of a display panel after binding according to Embodiment 5 of the present disclosure.
Figure 30:
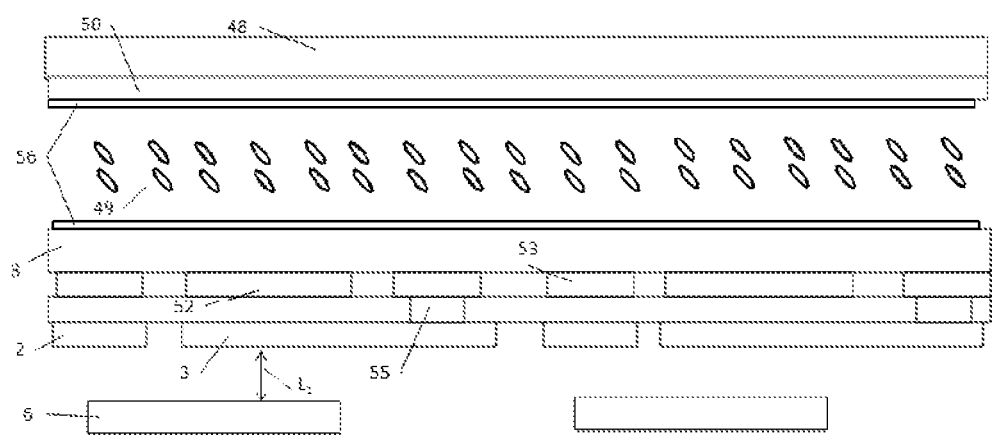
FIG. 30 is a schematic sectional view along line AR of FIG. 29.

As shown in FIGS. 29 and 30, since the display panel formed after the upper and lower substrates are bond is specifically applied to the LCD, in order to realize color display, a color film substrate 48 is also disposed on the side of the second substrate 8 opposite from the first substrate, and a back side of the color film substrate 48 and the second substrate 8 are coated with a liquid crystal alignment layer 56. A liquid crystal layer 49 is filled between the two substrates.

Since there are metal wires in the AA' cross section (that is, the switching signal lines 27, and the portion thereof serves as the second electrode 2), in order to prevent reflection by metal, the color film substrate 48 on the cross section here should also be provided with a black matrix 27 for shielding.

Figure 31:
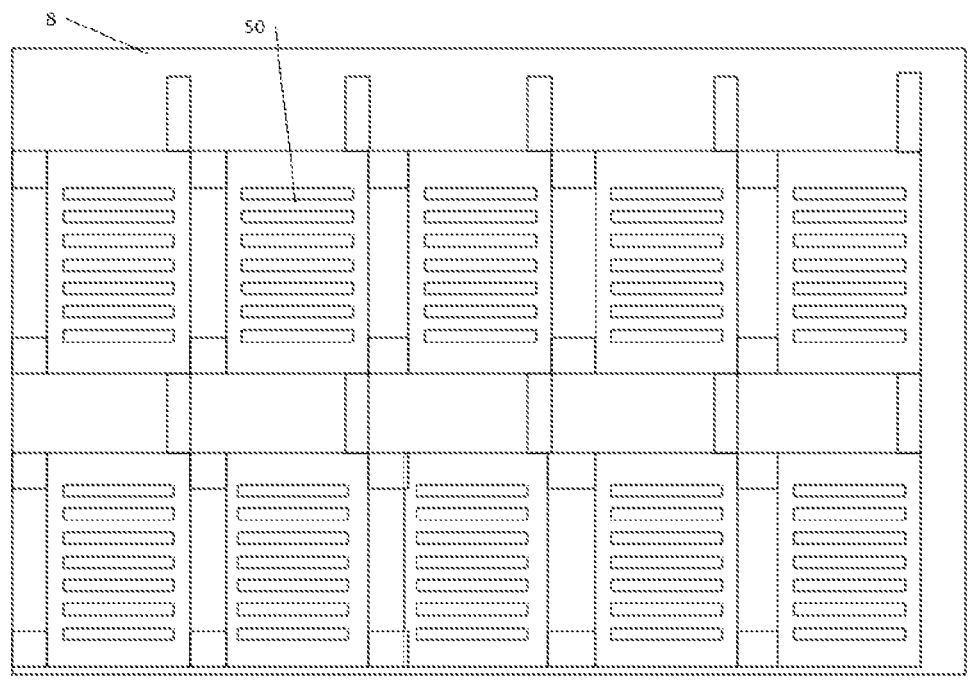
FIG. 31 is a schematic structural view of a common electrode in FIG. 29.

In order to realize the liquid crystal display, the pixel electrode 47 and the corresponding common electrode 50 are required. After the upper and lower substrates are bond, the second substrate 8 can be thinned and polished to reduce the thickness of the insulating layer between the pixel electrode 47 and the common electrode 50. For example, the thickness of the second substrate 8 can be reduced to about 0.1 μm. Afterwards, the common electrode 50 is formed on a surface of the second substrate 8 opposite from the first substrate, for example, by deposition of ITO and a photolithography process. Since the common electrode 50 is loaded with a uniform common signal across the entire panel, all the common electrodes are connected together to form an entire layer structure as shown in FIG. 31.

In order to increase the aperture ratio of the display surface, a slit may be formed on the common electrode 50, and the specific structure thereof may be similar to those in the prior art, which are not described in the embodiments of the present disclosure.

Figure 32:
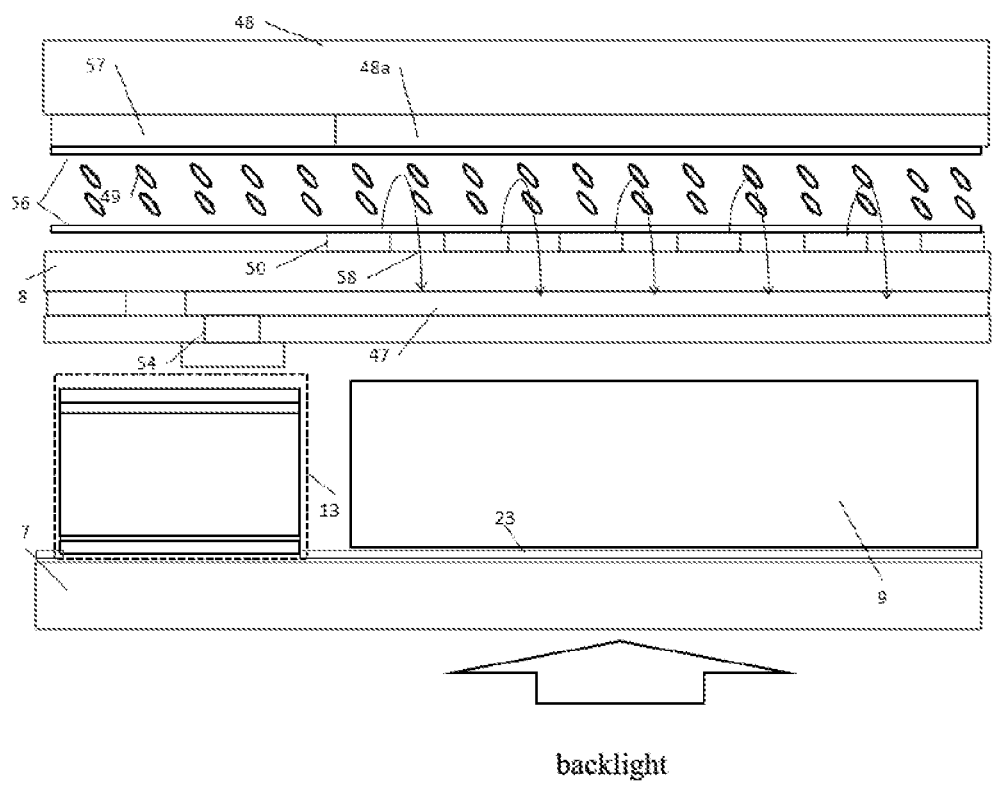
FIG. 32 is a first schematic structural sectional view along line BB' in FIG. 29.

FIG. 32 is a schematic structural view of a display panel along line B-B', wherein the display panel is a Fringe Field Switching (FFS) structure. In this structure, the stripe-shaped common electrode 50 on the back surface of the second substrate 8 and the opposing pixel electrode 47 form a fringe electric field, and the directions of the electric field lines 58 are as shown in the FIG. 32. The liquid crystal molecules in the liquid crystal layer 49 are deflected by the influence of the electric field, so that the polarization direction of the backlight transmitted through the lower substrate rotates in the liquid crystal layer 49 and finally exits through the color film layer 48a in the above color film substrate 48 to emit colored polarized light and display. The optical principle of the display panel is the same as that of a conventional TFT-LCD, which is not described in the embodiments of the present disclosure.

Figure 33:
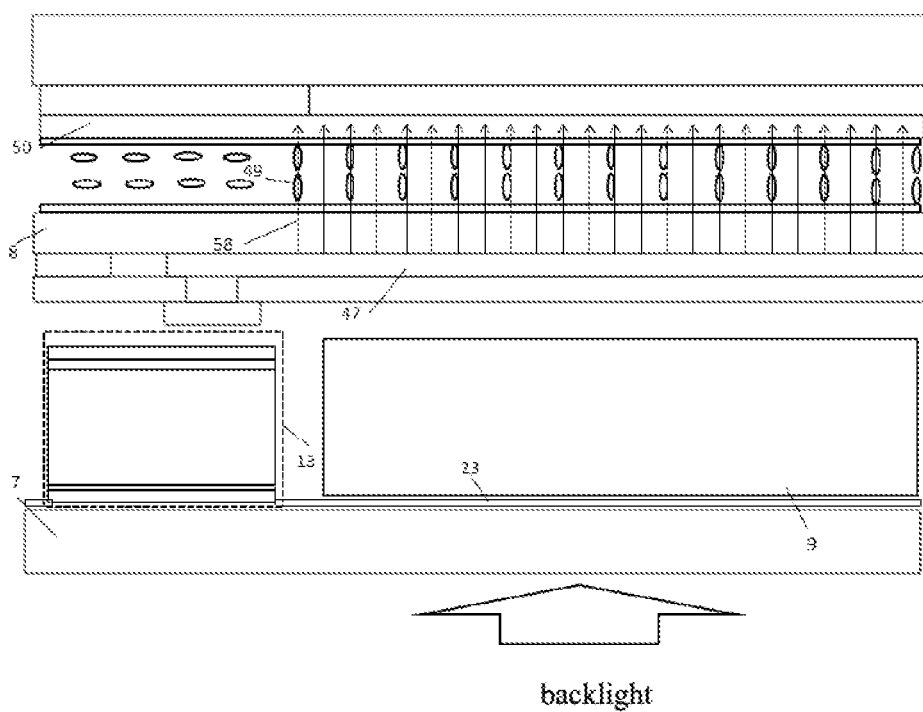
FIG. 33 is a second schematic structural sectional view along line BB' in FIG. 29.

FIG. 33 is a schematic structural view of a display panel along line B-B', where the display panel is in the Twist Nematic (TN) mode. Compared with the FFS structure shown in FIG. 32 described above, the difference is that the common electrode 50 is not disposed on the back surface of the second substrate 8, but on the lower surface of the color film substrate 48. In this structure, the common electrode 50 under the color film substrate 48 and the opposite pixel electrode 47 form a vertical electric field, and the direction of the electric field line 58 is as shown in FIG. 33. The liquid crystal molecules in the liquid crystal layer 49 are deflected by the influence of the electric field, so that the polarization direction of the backlight transmitted through the lower substrate rotates in in the liquid crystal layer 49 and finally exits through the color film layer 48a in the above color film substrate 48 to emit colored polarized light and display.

It should be noted that, in the above FIGS. 26-33, in order to simplify the description of the figures, only the corresponding reference numerals of the structures formed by the steps are emphasized in each figure, and for the structures not marked with the reference numerals in the figures, specific marks may be found in the figures of the previous steps.

An embodiment of the present disclosure further provides a method for manufacturing the above display panel. The manufacturing method includes the following:

In step 1, first electrodes, fourth electrodes, piezoelectric material layers, and connecting electrodes are formed on the first substrate. The first electrodes serve as the control terminals of the switch units; the piezoelectric material layers are formed between the first electrodes and the fourth electrodes. The connecting electrodes are disposed above the first electrodes and electrically insulated from the first electrodes, or the connecting electrodes are disposed above the fourth electrodes and electrically insulated from the fourth electrodes.

In step 2, second electrodes as input terminals of the switch units and third electrodes as output terminals of the switch units are formed on the second substrate. In each switch unit, the orthogonal projections of the second electrode and the third electrode on the plane of the connecting electrode overlap with the connecting electrode.

In step 3, a support is formed between the first substrate and the second substrate. The support is used to maintain a preset distance between the second electrode/the third electrode and the connecting electrode along the direction perpendicular to the surface direction of the connecting electrode.

In step 4, the first substrate and the second substrate are combined to form the display panel.

The thickness of the piezoelectric material layer may be increased under the electric field formed between the first electrode and the fourth electrode so that the connecting electrode is in contact with the second electrode and the third electrode.

In some embodiments, the above step 1 specifically includes forming one of a plurality of first metal scan lines and a plurality of second metal scan lines arranged in parallel on the first substrate; depositing a metal film and an insulating film sequentially on a piezoelectric film; coating an insulating adhesive on the first metal scan lines or the second metal scan lines; placing the side of the piezoelectric film opposite from the metal film and the insulating film on the insulating adhesive; sequentially patterning the insulating film, the metal film, and the piezoelectric film using the first metal scan lines or the second metal scan lines as the alignment target to form an insulating protective layer, piezoelectric material lines, and the other one of the first metal scan lines and the second metal scan lines; and forming a plurality of spaced connecting electrodes on the insulating protective layer. The first metal scan line, the second metal scan line, and the piezoelectric material line constitute a piezoelectric scan line. The first metal scan line is formed by sequentially connecting together first electrodes of any row. The second metal scan line is formed by sequentially connecting together the fourth electrodes of any row, and the piezoelectric material line is formed by sequentially connecting together the piezoelectric material layers located between the first electrode and the fourth electrode.

In some embodiments, the above step of forming any one of a plurality of first metal scan lines and a plurality of second metal scan lines arranged in parallel on the first substrate includes forming a plurality of first metal scan lines arranged in parallel on a display area of the first substrate and forming first metal wires and first binding electrodes disposed in the same layer as the first metal scan line outside the display area of the first substrate. The first metal scan line is electrically coupled to the first bonding electrode through the first metal wire.

Here, one end of the formed second metal scan line is a signal input terminal. The formed insulating protective layer covers the area other than the signal input terminal of the second metal scan line.

In some embodiments, the step of forming a plurality of spaced connecting electrodes arranged on the insulating protective layer further includes forming first reserved patterns having the same material as the connecting electrodes and covering the surfaces of the signal input terminals.

In some embodiments, based on the above, the above manufacturing method further includes forming a layer of conductive adhesives covering the surfaces of the first reserved patterns for transmitting a common signal on the second substrate to the signal input terminal.

Hem, in order to simplify the manufacturing process, a support may be formed on the first substrate and located between two adjacent piezoelectric scanning lines. Alternatively, the support may be located at a side of the piezoelectric scanning line farther away from the scanning drive circuit.

In some embodiments, the step of forming the second electrodes as the input terminals of the switch units and the third electrodes as the output terminals of the switch units on the second substrate includes forming a plurality of parallel-arranged switching signal lines intersecting the piezoelectric scanning lines and a plurality of third electrodes arranged in the column direction between two adjacent switching signal lines on the second substrate. A surface of the switching signal line facing the first substrate is on the same level as a surface of the third electrode facing the first substrate. An overlapping region where the switch signal line crosses the piezoelectric scan line is a second electrode.

In some embodiments, for the case where the above display panel is specifically applied to an AMOLED product, before the step of forming the second electrodes as the input terminals of the switch units and the third electrodes as the output terminals of the switch units on the second substrate, the manufacturing method further includes forming sub-pixel units controlled by the switch units on the second substrate.

In some embodiments, the above step of forming the sub-pixel units controlled by the switch units on the second substrate includes forming OLED components and driving transistors for driving the light emission of the OLED components on the second substrate. The driving transistor includes a driving gate, wherein the driving gate is the third electrode.

In some embodiments, the step of forming OLED components and driving transistors for driving the light emission of the OLED components on the second substrate includes forming an entire layer of OLED common electrode for loading a common signal on the second substrate and forming a light emitting functional layer corresponding to each sub-pixel unit and OLED second electrodes on the OLED common electrode. The light emitting functional layer, the OLED second electrode, and the OLED first electrode constitute an OLED component. The OLED first electrode corresponding to each sub-pixel unit is connected together to form the aforementioned OLED common electrode. Then, a first insulating layer is formed on the surface of the OLED component, and the first insulating layer has first through holes exposing the OLED second electrodes. A plurality of driving signal lines arranged in parallel are formed on the first insulation layer, and a plurality of driving drains and metal spacers arranged in the column direction between two adjacent driving signal lines are sequentially formed. The driving signal lines, the driving drains and the metal spacers are arranged in the same layer and have the same thickness. Each drive signal line corresponds to a column of OLED components. The driving drain is electrically coupled to the OLED second electrode through the first through hole; the metal spacer and the driving drain are respectively located on both sides of the driving signal line. The area of the driving signal line directly facing the driving drain is the driving source. Then, a semiconductor layer is formed on the driving source and the driving drain. Semiconductor spacers are formed on the metal spacers. The third electrode, the semiconductor layer, the driving source, and the driving drain constitute the driving transistor. The semiconductor spacer and the semiconductor layer are arranged in the same layer and have the same thickness. Then, a second insulating layer covering the OLED component, the driving transistors and the driving signal lines are formed. The side of the support facing the second substrate is in contact with the second insulating layer. The switching signal line and the third electrode are disposed on the second insulating layer. The switch signal line has the same thickness as the third electrode. The orthogonal projection of the switching signal line on the second substrate overlaps the orthogonal projection of the metal spacer on the second substrate and the orthogonal projection of the semiconductor spacer on the second substrate.

In some embodiments, while the plurality of driving signal lines arranged in parallel are sequentially formed on the first insulation layer, and second metal wires and second bonding electrodes are also formed. The driving signal lines are disposed in the display area of the second substrate. The second metal wires and the second binding electrodes are disposed outside the display area, and the driving signal line is electrically coupled with the second binding electrode through the second metal wire. The formed second insulating layer exposes signal output terminals on the OLED common electrodes for transmitting the loaded common signal to the first substrate, and the second insulating layer has bonding through holes exposing the second bonding electrodes.

In some embodiments, the step of forming the sub-pixel units controlled by the switch units on the second substrate includes forming a full-layer OLED common electrode for loading a common signal on the second substrate, forming an light emitting functional layer corresponding to each sub-pixel unit on the OLED common electrode, and forming an insulating spacer disposed in the same layer and having the same thickness as the light emitting functional layer. The light emitting functional layer, the third electrode, and the OLED first electrode constitute an OLED component. The OLED first electrode corresponding to each sub-pixel unit is connected together to form an OLED common electrode. The insulating spacers are disposed at least between two adjacent columns of OLED components. The switching signal lines are formed on the insulating spacers. The switching signal line has the same thickness as the third electrode.

In some embodiments, for the case that the above display panel is specifically applied to an LCD product, the above-mentioned step of forming sub-pixel units controlled by switch units on the second substrate specifically includes forming pixel electrodes electrically coupled to the third electrodes. The above manufacturing method also includes forming a color film substrate, a liquid crystal layer, and a common electrode. The color film substrate is formed on a side of the second substrate opposite from the first substrate. The liquid crystal layer is formed between the color film substrate and the second substrate; the common electrode is formed on the side of the second substrate facing the liquid crystal layer, or the common electrode is formed on the color film substrate.

In some embodiments, the above manufacturing method further includes forming common signal wires disposed in the same layer as the pixel electrodes and height spacers disposed in the same layer as the common signal wires on the second substrate. A first electrode of the storage capacitor corresponding to each pixel electrode is extended from the common signal wire. Then, a third insulating layer is formed on the pixel electrodes, the common signal wires, and the first electrodes of the storage capacitors. The third insulating layer has through holes exposing pixel electrodes. The switching signal lines and the third electrodes are disposed on the third insulating layer. The orthogonal projection of the switching signal line on the second substrate overlaps the orthographic projection of the height spacer on the second substrate. The orthogonal projection of the third electrode on the second substrate overlaps the orthogonal projection of the first electrode of the storage capacitor on the second substrate, and the third electrode is electrically coupled with the pixel electrode through the through hole. The pixel electrode, the common signal wire, and the first electrode of the storage capacitor have the same thickness. The thickness of the switching signal line is the same as the thickness of the third electrode.

In some embodiments, the above-mentioned first substrate has a scan driving circuit binding area outside the display area, and the second substrate has a data driving circuit binding area outside the display area. The manufacturing method further includes forming a scan drive circuit in the scan driving circuit binding area for providing signals to the first metal scan line and forming a data driving circuit in the data driving circuit binding area for providing signals to the switching signal line.

In some embodiments, based on this, step (4) above specifically includes forming a sealant frame enclosing the display area between the first substrate and the second substrate and aligning and binding the first substrate with the second substrate by the sealant frame to form a display panel. The scan driving circuit binding area and the data driving circuit binding area are all located outside the sealant frame.

Based on the foregoing, an embodiment of the present disclosure further provides a display apparatus including the above display panel. The display apparatus may be an LCD display apparatus or an OLED display apparatus. Specifically, it may be a product or component having any display function such as a display, a television, a digital camera, a mobile phone, a tablet computer, or a navigator.

The principles and the embodiments of the disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

DESCRIPTION OF SYMBOLS IN THE DRAWINGS

1—first electrode;
2—second electrode;
3—third electrode;
4—fourth electrode;
5—piezoelectric material layer;
6—connecting electrode;
7—first substrate;
8—second substrate;
9—Support;
10—first metal scan line;
11—second metal scan line;
12—piezoelectric material line;
12a—first piezoelectric material layer;
12b—second piezoelectric material layer;
13—piezoelectric scan line;
14—insulating protective layer;
15—first metal wire;
16—first bonding electrode;
17—scan driving circuit;
18—first reserved pattern;
19—conductive adhesive;
20—piezoelectric layer;
21—second metal layer,
22—insulating material;
23—insulating adhesive;
24—electrode signal input region;
25—frame sealant;
26—auxiliary electrode;
27—switch signal line;
28—OLED first electrode or OLED common electrode;
29—OLED component;
30—drive source;
31—drive drain;
32—semiconductor layer;
33—first insulation layer;
34—first through hole;
35—drive signal line;
36—metal spacer
37—semiconductor spacer;

38—second insulating layer;
39—signal output terminal;
40—second metal wire;
41—second bonding electrode;
42—bonding through hole;
43—third bonding electrode;
44—IPZT;
45—insulation spacer;
46—fourth binding electrode
47—pixel electrode;
48—color film substrate;
48a—color film layer;
49—liquid crystal layer;
50—common electrode;
51—common signal wiring;
52—first electrode of a storage capacitor;
53—height spacer
54—through hole;
55—signal output line;
56—liquid crystal alignment layer;
57—black matrix;
58—electric field line.

What is claimed is:

1. A display panel, comprising:
a plurality of switch units,
each of the plurality of the switch units, comprising:
a first electrode;
a second electrode;
a third electrode;
a fourth electrode opposite the first electrode;
a piezoelectric material layer between the first electrode and the fourth electrode;
a connecting electrode between the second electrode/the third electrode and the fourth electrode; and
a driving transistor comprising a driving gate and the driving gate being the third electrode;
wherein an orthogonal projection of the second electrode and an orthogonal projection of the third electrode on a plane of the connecting electrode overlap the connecting electrode respectively and there is a first distance respectively between the second electrode and the connecting electrode and between the third electrode and the connecting electrode along a direction perpendicular to the plane of the connecting electrode, and
wherein the driving transistor is configured to drive an OLED component to emit light.

2. The display panel according to claim 1, further comprising:
a first substrate;
a second substrate opposite the first substrate; and
a plurality of sub-pixel units controlled by the plurality of the switch units respectively,
wherein the first electrode, the fourth electrode, the piezoelectric material layer, and the connecting electrode are on a surface of the first substrate facing the second substrate; and
the second electrode, the third electrode, and the sub-pixel units are on a surface of the second substrate facing the first substrate.

3. The display panel according to claim 2, wherein in a row of the switch units, first electrodes thereof are sequentially connected to form a first metal scan line, fourth electrodes thereof are sequentially connected to form a second metal scan line, and piezoelectric material layers thereof are sequentially connected to form a piezoelectric material line;
the first metal scan line, the second metal scan line, and the piezoelectric material line constitute a piezoelectric scan line; and
connecting electrodes of the row of the switching unit are arranged on the piezoelectric scanning line at intervals.

4. The display panel according to claim 3, further comprising a support between the first substrate and the second substrate;
wherein the support is located between two adjacent piezoelectric scanning lines on the first substrate or at a side of the piezoelectric scanning line opposite from a scanning drive circuit on the first substrate; and
the support is configured to maintain the first distance respectively between the second electrode and the connecting electrode and between the third electrode and the connecting electrode.

5. The display panel according to claim 3, further comprising an insulating protective layer on the piezoelectric scanning line;
wherein the connecting electrodes are disposed on the insulating protective layer.

6. The display panel according to claim 3, further comprising a first metal wire and a first bonding electrode disposed in the same layer as the first metal scan line;
wherein the first metal scan line is in a display area of the first substrate, the first metal wire and the first bonding electrode are outside the display area, and the first metal scan line is electrically coupled to the first bonding electrode through the first metal wire; and
wherein one end of the second metal scan line is a signal input terminal, and the insulating protective layer covers the second metal scan line except the signal input terminal, a surface of the signal input terminal is covered with a first reserved pattern made of a same material as the connecting electrode, and a conductive adhesive covers a surface of the first reserved pattern for transmitting a common signal on the first substrate to the signal input terminal.

7. The display panel according to claim 3, wherein the piezoelectric material line comprises a first piezoelectric material layer and a second piezoelectric material layer, and directions of deformation of the first piezoelectric material layer and the second piezoelectric layer under an electric field are cumulative; and
wherein an auxiliary electrode is between the first piezoelectric material layer and the second piezoelectric material layer.

8. The display panel according to claim 3, wherein each of the plurality of the sub-pixel units comprises the OLED component; the OLED component comprising an OLED first electrode, a light emitting functional layer, and an OLED second electrode sequentially disposed in a direction away from the second substrate.

9. The display panel according to claim 8, further comprising:
a first insulating layer on a surface of the OLED component, and the first insulating layer comprising a plurality of first through holes, each of the plurality of first through holes exposing the OLED second electrode; and
a plurality of parallel driving signal lines on the first insulating layer, each of the driving signal lines corresponding to a column of OLED components;
wherein the driving transistor further comprises a driving source and a driving drain opposite the driving source, and a semiconductor layer in contact with the driving source and the driving drain; the driving drain and each of the driving signal lines are disposed in a same layer and have a same thickness; the driving drain is electrically coupled to the OLED second electrodes through a first through hole in the first insulating layer; and a part of each of the driving signal lines directly opposite the driving drain is the driving source.

10. The display panel according to claim 9, further comprising:

a second insulating layer covering the OLED component, the driving transistor and the driving signal lines; and a plurality of switching signal lines and a plurality of third electrodes on the second insulating layer;

wherein a surface of each of the plurality of the switching signal lines facing the first substrate and a surface of each of plurality of the third electrodes facing the first substrate are at the same level.

11. The display panel according to claim 10, wherein
the switching signal lines and the third electrodes have a same thickness;

an orthogonal projection of each of the plurality of the switching signal lines on the plane where the piezoelectric scan line is located intersects the piezoelectric scan line to form an intersecting region, and a portion of each of the switching signal lines directly opposite the intersecting region is the second electrode;

a side of the support facing the second substrate is in contact with the second insulating layer.

12. The display panel according to claim 11, wherein a part of the driving drain, a part of the second insulating layer, and a part of each of the third electrodes constitute a storage capacitor.

13. The display panel according to claim 12, further comprising:

a second metal wire and a second bonding electrode on the second substrate in the same layer as the driving signal lines;

wherein the driving signal lines are disposed in a display area of the second substrate; the second metal wires and the second bonding electrodes are disposed outside the display area; and the driving signal lines are electrically connected to the second binding electrodes through the second metal wires.

14. The display panel according to claim 13, wherein the OLED first electrode of each of the OLED components is connected together to form a unitary common OLED first electrode.

15. The display panel according to claim 3, wherein each of the sub-pixel units further comprises a pixel electrode electrically coupled to the third electrode;

the display panel further comprises a color film substrate, a liquid crystal layer, and a common electrode; the color film substrate is at a side of the second substrate away from the first substrate; and the liquid crystal layer is between the second substrate and the color film substrate; and a common electrode is at a side of the second substrate facing the liquid crystal layer, or the common electrode is on the color film substrate.

16. The display panel according to claim 15, further comprising:

a plurality of switching signal lines and a plurality of third electrodes on the second substrate;

wherein a surface of each of the plurality of the switching signal lines facing the first substrate and a surface of each of plurality of the third electrodes facing the first substrate are at the same level.

17. The display panel according to claim 1, wherein the first distance is in a range of approximately 0.1 µm to 0.5 µm.

18. A display apparatus, comprising the display panel according to claim 1.

19. A switch unit, comprising
a first electrode;
a second electrode;
a third electrode;
a fourth electrode opposite the first electrode;
a piezoelectric material layer between the first electrode and the fourth electrode; and
a connecting electrode between the second electrode/the third electrode and the fourth electrode;
wherein an orthogonal projection of the second electrode and an orthogonal projection of the third electrode on a plane of the connecting electrode overlap the connecting electrode respectively and there is a first distance respectively between the second electrode and the connecting electrode and between the third electrode and the connecting electrode along a direction perpendicular to the plane of the connecting electrode.

20. The switch unit according to claim 19, wherein the first distance is in a range of approximately 0.1 µm to 0.5 µm.

* * * * *